(12) United States Patent
Park et al.

(10) Patent No.: US 11,482,263 B2
(45) Date of Patent: Oct. 25, 2022

(54) NON-VOLATILE MEMORY DEVICE, CONTROLLER FOR CONTROLLING THE SAME, STORAGE DEVICE INCLUDING THE SAME, AND READING METHOD THEREOF

(71) Applicant: SAMSUNG ELECTRONICS CO., LTD., Suwon-si (KR)

(72) Inventors: Sehwan Park, Yongin-si (KR); Jinyoung Kim, Seoul (KR); Youngdeok Seo, Seoul (KR); Ilhan Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/239,647

(22) Filed: Apr. 25, 2021

(65) Prior Publication Data

US 2022/0130437 A1 Apr. 28, 2022

(30) Foreign Application Priority Data

Oct. 28, 2020 (KR) .................. 10-2020-0141257

(51) Int. Cl.
*G11C 7/10* (2006.01)
*G11C 7/14* (2006.01)
*G11C 7/18* (2006.01)
*G11C 8/08* (2006.01)

(52) U.S. Cl.
CPC ............ *G11C 7/1063* (2013.01); *G11C 7/106* (2013.01); *G11C 7/1039* (2013.01); *G11C 7/1057* (2013.01); *G11C 7/1084* (2013.01); *G11C 7/1087* (2013.01); *G11C 7/14* (2013.01); *G11C 7/18* (2013.01); *G11C 8/08* (2013.01)

(58) Field of Classification Search
CPC ... G11C 7/1063; G11C 7/1039; G11C 7/1057; G11C 7/106; G11C 7/1084; G11C 7/1087; G11C 7/14; G11C 7/18; G11C 8/08
See application file for complete search history.

(56) References Cited

U.S. PATENT DOCUMENTS

| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,268,631 | B2 | 2/2016 | Leem et al. |

(Continued)

OTHER PUBLICATIONS

European Search Report dated Feb. 25, 2022 Cited in Corresponding Application No. EP 21182404.0.

*Primary Examiner* — Ajay Ojha
(74) *Attorney, Agent, or Firm* — Volentine, Whitt & Francos, PLLC

(57) ABSTRACT

A storage device includes at least one non-volatile memory device and a controller configured to control the at least one non-volatile memory device. The at least one non-volatile memory device performs an on-chip valley search (OVS) operation by latching a read command at an edge of a write enable (WE) signal according to a command latch enable (CLE) signal and an address latch enable (ALE) signal. The controller receives detection information according to the OVS operation from the at least one non-volatile memory device in response to a specific command. The OVS operation includes a first OVS operation using a read level and a second OVS operation using a changed read level.

20 Claims, 27 Drawing Sheets

(56) References Cited

U.S. PATENT DOCUMENTS

| | | | |
|---|---|---|---|
| 9,472,300 | B2 | 10/2016 | Park |
| 9,536,970 | B2 | 1/2017 | Seol et al. |
| 9,715,341 | B2 | 7/2017 | Kim et al. |
| 9,921,749 | B2 | 3/2018 | Kim et al. |
| 10,090,046 | B2 | 10/2018 | Park et al. |
| 10,120,589 | B2 | 11/2018 | Jung |
| 10,269,436 | B2 | 4/2019 | Matsunaga |
| 10,373,693 | B2 | 8/2019 | Cha et al. |
| 10,381,090 | B2 | 8/2019 | Oh et al. |
| 10,558,381 | B2 | 2/2020 | Chin et al. |
| 10,559,362 | B2 | 2/2020 | Shin et al. |
| 10,573,394 | B2 | 2/2020 | Pan et al. |
| 10,607,708 | B2 | 3/2020 | Oh et al. |
| 10,629,259 | B2 | 4/2020 | Jang |
| 2014/0281678 | A1 | 9/2014 | Haga et al. |
| 2017/0133087 | A1* | 5/2017 | Park ............... G11C 11/5642 |
| 2018/0033491 | A1* | 2/2018 | Marelli ............ G06F 11/076 |
| 2018/0204624 | A1* | 7/2018 | Yoon ............... G11C 16/0458 |
| 2020/0090763 | A1 | 3/2020 | Tokutomi et al. |
| 2020/0126621 | A1 | 4/2020 | Park et al. |
| 2020/0098436 | A1 | 5/2020 | Kim et al. |
| 2020/0159464 | A1 | 5/2020 | Park |
| 2020/0286545 | A1 | 9/2020 | Yoon |
| 2022/0005539 | A1 | 1/2022 | Kim et al. |

* cited by examiner

|  |  | OVS Detect Case | | | | | | |
|---|---|---|---|---|---|---|---|---|
|  |  | C1 | C2 | C3 | C4 | C5 | C6 | C7 |
| State | R1 | -40 mV | -32 mV | -16 mV | 0 mV | 16 mV | 32 mV | 40 mV |
|  | R2 | -30 mV | -24 mV | -12 mV | 0 mV | 12 mV | 24 mV | 30 mV |
|  | R3 | -20 mV | -10 mV | -8 mV | 0 mV | 8 mV | 16 mV | 20 mV |
|  | R4 | -40 mV | -30 mV | -16 mV | 0 mV | 16 mV | 32 mV | 40 mV |
|  | R5 | -60 mV | -40 mV | -24 mV | 0 mV | 24 mV | 48 mV | 60 mV |
|  | R6 | -80 mV | -60 mV | -32 mV | 0 mV | 32 mV | 64 mV | 80 mV |
|  | R7 | -100 mV | -80 mV | -40 mV | 0 mV | 40 mV | 80 mV | 100 mV |

FIG. 13A

HRT : Before Update

|  | R1 | R2 | R3 | R4 | R5 | R6 | R7 |
|---|---|---|---|---|---|---|---|
| Level Offset | 0 mV | 0 mV | 0 mV | 0 mV | 0 mV | 0 mV | 0 mV |

HRT : After Update

|  | R1 | R2 | R3 | R4 | R5 | R6 | R7 |
|---|---|---|---|---|---|---|---|
| Level Offset | 0 mV | 0 mV | 0 mV | 0 mV | 0 mV | 0 mV | -100 mV |

FIG. 13B

|  |  | OVS Detect Case |  |  |  |  |  |  |
|---|---|---|---|---|---|---|---|---|
|  |  | C1 | C2 | C3 | C4 | C5 | C6 | C7 |
| State | R1 | −40 mV | −32 mV | −16 mV | 0 mV | 16 mV | 32 mV | 40 mV |
|  | R2 | −30 mV | −24 mV | −12 mV | 0 mV | 12 mV | 24 mV | 30 mV |
|  | R3 | −20 mV | −10 mV | −8 mV | 0 mV | 8 mV | 16 mV | 20 mV |
|  | R4 | −40 mV | −30 mV | −16 mV | 0 mV | 16 mV | 32 mV | 40 mV |
|  | R5 | −60 mV | −40 mV | −24 mV | 0 mV | 24 mV | 48 mV | 60 mV |
|  | R6 | −80 mV | −60 mV | −32 mV | 0 mV | 32 mV | 64 mV | 80 mV |
|  | R7 | −100 mV | −80 mV | −40 mV | 0 mV | 40 mV | 80 mV | 100 mV |

FIG. 13C

HRT : Before Update

|  | R1 | R2 | R3 | R4 | R5 | R6 | R7 |
|---|---|---|---|---|---|---|---|
| Level Offset | 0 mV | 0 mV | 0 mV | 0 mV | 0 mV | 0 mV | −100 mV |

HRT : After Update

|  | R1 | R2 | R3 | R4 | R5 | R6 | R7 |
|---|---|---|---|---|---|---|---|
| Level Offset | 0 mV | 0 mV | 0 mV | 0 mV | 0 mV | 0 mV | −180 mV |

FIG. 13D

NON-VOLATILE MEMORY DEVICE, CONTROLLER FOR CONTROLLING THE SAME, STORAGE DEVICE INCLUDING THE SAME, AND READING METHOD THEREOF

CROSS-REFERENCE TO RELATED APPLICATION(S)

This application claims benefit of priority to Korean Patent Application No. 10-2020-0141257 filed on Oct. 28, 2020 in the Korean Intellectual Property Office, the disclosure of which is incorporated herein by reference in its entirety.

BACKGROUND

Example embodiments of the present disclosure relate to a non-volatile memory device, a controller for controlling the same, a storage device including the same, and a reading method thereof.

Generally, a storage device may generate an error correction code using an error correction code (ECC) circuit in a write operation and may correct an error in data by referring to the error correction code in a read operation. However, it may be impossible to correct the error using the ECC circuit when deterioration of memory cells of the storage device is severe. In this case, a read retry operation using a sensing technique different from that of a normal read operation may be performed.

SUMMARY

An example embodiment of the present disclosure is to provide a non-volatile memory device for extending a correction range of a recovery code, a controller for controlling the same, a storage device including same, and a reading method thereof.

According to an example embodiment of the present disclosure, a reading method of a storage device, including at least one non-volatile memory device and a controller for controlling the at least one non-volatile memory device, includes performing a first on-chip valley search (OVS) operation in response to a read command by the at least one non-volatile memory device; receiving first detection information of the first OVS operation in response to a specific command by the controller; updating a second table with a first offset corresponding to the first detection information using a first table by the controller; and performing a second OVS operation using the second table in response to a reissued read command by the at least one non-volatile memory device. The first table includes the first offset according to a detection case for each state, and the second table includes a second offset of a read level for each state.

According to another example embodiment of the present disclosure, a reading method of a storage device including at least one non-volatile memory device and a controller for controlling the at least one non-volatile memory device includes determining whether to perform a history read operation or a normal read operation according to a read request; performing the history read operation or the normal read operation; determining whether data read in the history read operation or the normal read operation is uncorrectable; entering an on-chip valley search (OVS) recovery code when the read data is uncorrectable; performing a first OVS operation with reference to a read level in the OVS recovery code; determining a first detection case according to the first OVS operation; determining whether the first OVS operation is passed; determining whether to allow a second OVS operation when the OVS operation is not passed; changing the read level when the second OVS operation is allowed; performing the second OVS operation with reference to the changed read level; and updating a history read table with an offset corresponding to the detection case when the OVS recovery code is passed.

According to an example embodiment of the present disclosure, a non-volatile memory device includes a memory cell array including a plurality of memory blocks having a plurality of memory cells connected to a plurality of wordlines and a plurality of bitlines; a row decoder configured to select one of the plurality of memory blocks in response to an address; a voltage generator configured to provide wordline voltages corresponding to selected wordlines and unselected wordlines from among the plurality of wordlines; page buffers connected to the plurality of bitlines and configured to read data from memory cells connected to a selected wordline of a selected memory block among the plurality of memory blocks; and a control logic configured to control the row decoder, the voltage generator, and the page buffers. The control logic includes an OVS circuit configured to receive a command latch enable (CLE) signal, an address latch enable (ALE) signal, a chip enable (CE) signal, a write enable (WE) signal, a read enable (RE) signal, and a DQS signal through control pins and to perform an on-chip valley search (OVS) by latching a command or an address at an edge of the WE signal according to the CLE signal and the ALE signal. The OVS circuit performs a first OVS operation with reference to a read level and performs a second OVS operation with reference to a changed read level.

According to another example embodiment of the present disclosure, a non-volatile memory device includes a memory cell region having a first metal pad; a peripheral circuit region having a second metal pad and vertically connected to the first metal pad through the second metal pad; a memory cell array including a plurality of memory blocks having a plurality of memory cells connected to a plurality of wordlines and a plurality of bitlines in the memory cell region; a row decoder configured to select one of the plurality of wordlines in the peripheral circuit region; a page buffer circuit having a plurality of page buffers connected to the plurality of bitlines in the peripheral circuit region; and a control logic configured to receive a command latch enable (CLE) signal, an address latch enable (ALE) signal, a chip enable (CE) signal, a write enable (WE) signal, a read enable (RE) signal, and a DQS signal through control pins, and to perform an on-chip valley search (OVS) by latching a command or an address at an edge of the WE signal according to the CLE signal and the ALE signal, in the peripheral circuit region. The OVS operation includes a first OVS operation using a read level and a second OVS operation using a changed read level.

According to an example embodiment of the present disclosure, a controller includes control pins configured to provide control signals to at least one non-volatile memory device; a buffer memory configured to store a first table and a second table; an error correction circuit configured to correct an error of first data read from the at least one non-volatile memory device according to a first read command or to correct an error of second data read from the at least one non-volatile memory device according to a second read command; and a processor configured to drive a read level compensation unit for managing a read level of a read operation of the at least one non-volatile memory device. The first table includes a first offset according to a detection case for each state in an on-chip valley search (OVS) operation. The second table includes a second offset of the read level for each state. The read level compensation unit is configured to update the second offset using the first offset regardless of failure of a read operation according to the second read command.

According to an example embodiment of the present disclosure, a storage device includes at least one non-volatile memory device; and a controller connected to the at least one non-volatile memory device through control pins providing a command latch enable (CLE) signal, an address latch enable (ALE) signal, a chip enable (CE) signal, a write enable (WE) signal, a read enable (RE) signal, and a DQS signal, and configured to read data from the at least one non-volatile memory. The at least one non-volatile memory device performs an on-chip valley search (OVS) operation by latching a read command at an edge of the WE signal according to the CLE signal and the ALE signal. The controller receives detection information according to the OVS operation from the at least one non-volatile memory device in response to a specific command. The OVS operation includes a first OVS operation using a read level and a second OVS operation using a changed read level.

BRIEF DESCRIPTION OF DRAWINGS

The above and other aspects, features, and advantages of the present disclosure will be more clearly understood from the following detailed description, taken in conjunction with the accompanying drawings, in which:

FIGS. 13A, 13B, 13C, and 13D are diagrams illustrating a process of updating offset data of an HRT in a read operation of a storage device according to an example embodiment of the present disclosure;

DETAILED DESCRIPTION

Hereinafter, embodiments of the present disclosure will be described as follows with reference to the accompanying drawings.

A threshold voltage distribution of a memory cell may be modified by at least one cause (retention, disturbance, temperature, noise, or the like). The threshold voltage distribution modified as above may cause an error (that is, error correction is not possible) in a read operation. A recovery code refers to a method of recovering an error of data read in a read operation. Generally, a recovery code may include a process of searching for a modified threshold voltage distribution valley. An on-chip valley search (hereinafter, referred to as "OVS") operation may be advantageous for searching for the distribution valley. The OVS operation is described in detail in US 2020-00286545, US 2020-0098436, U.S. Pat. Nos. 10,090,046, 10,559,362, 10,607, 708, and 10,629,259, which are incorporated herein by references.

According to a non-volatile memory device, a storage device having the same, and a reading method thereof in the example embodiment, to extend a correction range of an OVS operation after entering a recovery code, detection information corresponding to a distribution valley may be reflected in a history read level table (HRT) regardless of a failure (or success) of a first OVS operation. Thereafter, in a second OVS operation, the distribution valley may be searched using the history read level table reflected with the read level offset of the first OVS operation, thereby reducing search latency.

Figure 1:
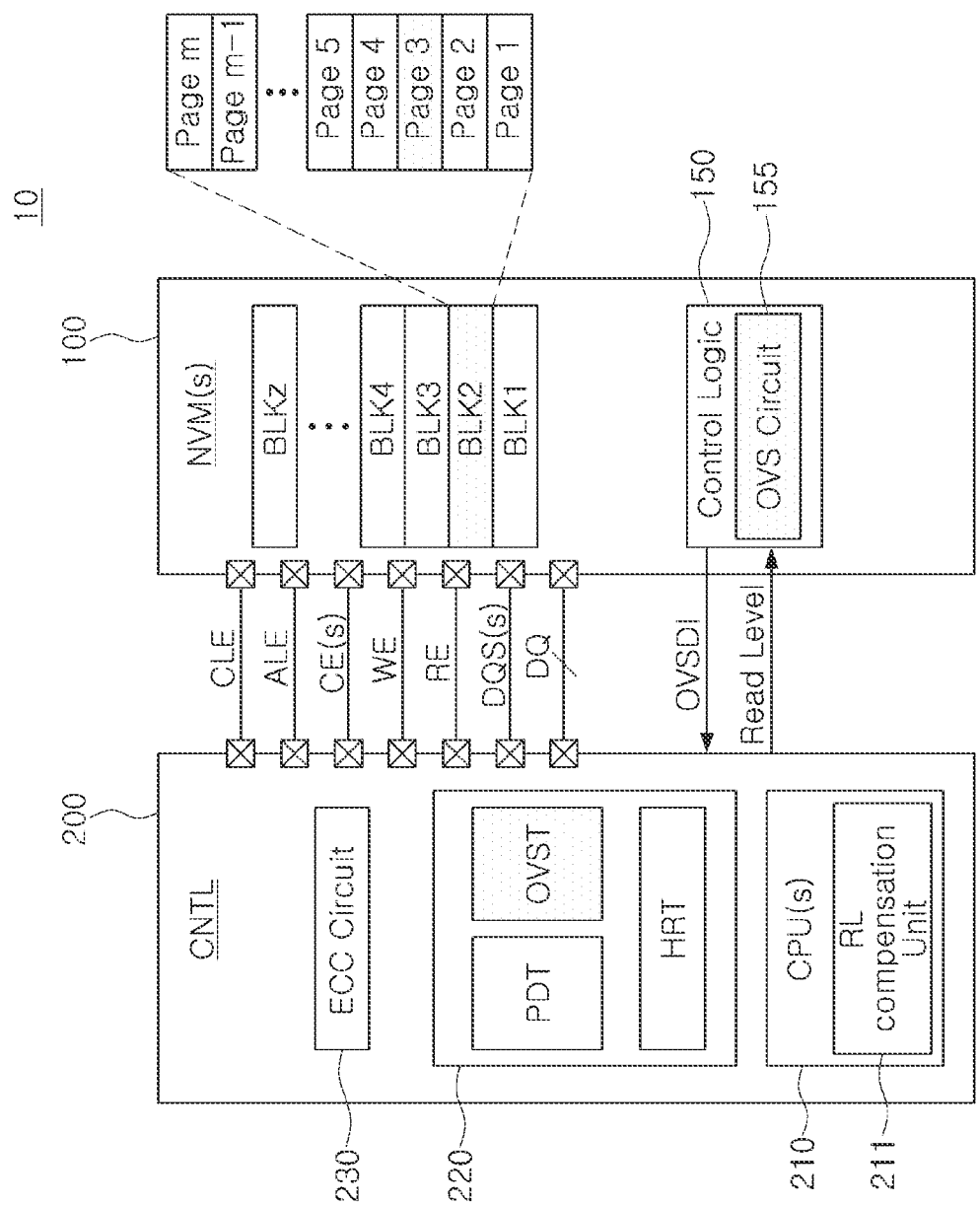
FIG. 1 is a diagram illustrating a storage device according to an example embodiment of the present disclosure.

FIG. 1 is a diagram illustrating a storage device 10 according to an example embodiment. Referring to FIG. 1, a storage device 10 may include at least one non-volatile memory device NVM(s) 100 and a controller CNTL 200.

The at least one non-volatile memory device 100 may be implemented to store data. The non-volatile memory device 100 may include a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. Also, the non-volatile memory device 100 may be implemented in a three-dimensional array structure. The example embodiment may be applicable to a flash memory device, in which a charge storage layer is formed of a conductive floating gate, and also to a charge trap flash (CTF) in which a charge storage layer is formed of an insulating film. In the description below, the non-volatile memory device 100 may be implemented as a vertical NAND flash memory device (VNAND) for ease of description.

The non-volatile memory device 100 may be implemented to include a plurality of memory blocks BLK1 to BLKz (where z is an integer equal to or greater than 2) and a control logic 150.

Each of the plurality of memory blocks BLK1 to BLKz may include a plurality of pages Page 1 to Page m (where m is an integer equal to or greater than 2). Each of the plurality of pages Page 1 to Page m may include a plurality of memory cells. Each of the plurality of memory cells may store at least one bit.

The control logic 150 may be implemented to receive a command and an address from the controller CNTL 200 and may perform an operation (a program operation, a read operation, an erase operation, or the like) corresponding to the received command on the memory cells corresponding to the address.

Also, the control logic 150 may include an OVS circuit 155. The OVS circuit 155 may be implemented to perform an on-chip valley search OVS operation. Generally, the OVS operation may include an operation of acquiring a cell count according to various develop times, an operation of determining an OVS detection case based on the acquired cell count, and a main sensing operation of changing and sensing an actual develop time according to the determined OVS detection case. The OVS circuit 155 may be implemented to store detection information (OVSDI, detection case information) corresponding to the result of the OVS operation. The detection information OVSDI may include information (e.g., develop time information) indicating an optimal distribution valley corresponding to a respective state.

The controller CNTL (200) may be connected to the at least one non-volatile memory device 100 through a plurality of control pins configured to transmit control signals (e.g., CLE, ALE, CE(s), WE, RE, DQSs, DQ, or the like), and may be implemented to control the non-volatile memory device 100 using the control signals (CLE, ALE, CE(s), WE, RE, or the like). For example, the non-volatile memory device 100 may, by latching a command CMD or an address ADD at an edge of a write enable (WE) signal according to a command latch enable (CLE) signal and an address latch enable (ALE) signal, perform a program operation/read operation/erase operation.

The controller 200 may include at least one processor 210 (CPU; central processing unit)), a buffer memory 220, and an error correction circuit 230.

The processor 210 may be implemented to control overall operation of the storage device 10. The processor 210 may perform various management operations such as cache/buffer management, firmware management, garbage collection management, wear leveling management, data de-duplication management, read refresh/reclaim management, bad block management, multi-stream management, host data and non-volatile memory mapping management, quality of service (QoS) management, system resource allocation management, non-volatile memory queue management, read level management, erase/program management, hot/cold data management, power loss protection management, dynamic thermal management, initialization management, and redundant array of inexpensive disk (RAID) management.

The processor 210 may drive the read level compensation unit 211 for managing a read level. The read level compensation unit 211 may reflect detection information OVSDI (offset information), corresponding to the result of performing the OVS operation, in the history read level in real time. For example, the read level compensation unit 211 may accumulate an offset corresponding to the detection information OVSDI in a history read level table (HRT) using an OVS table (OVST). In the example embodiment, the read level compensation unit 211 may be implemented in firmware/software. The read level compensation unit 211 illustrated in FIG. 1 may be performed in the controller 200. However, an example embodiment thereof is not limited thereto. The read level compensation unit 211 may be performed in the non-volatile memory device 100.

The buffer memory 220 may be implemented by a volatile memory (e.g., static random access memory (SRAM), dynamic RAM (DRAM), synchronous RAM (SDRAM), or the like) or a non-volatile memory (a flash memory, phase-change RAM (PRAM), magneto-resistive RAM (MRAM), resistive RAM (ReRAM), ferro-electric RAM (FRAM), or the like). The buffer memory 220 may include at least one predefined table (PDT), OVS table (OVST), and history read level table (HRT).

The PDT may include first read level offset information. In the example embodiment, the PDT may include first read level offset information corresponding to an elapsed programming time. In the example embodiment, the PDT may include first read level offset information corresponding to various deterioration information (temperature, program/erase cycle, read cycle, open wordline case, wordline position information, or the like) in addition to the program elapsed time.

The OVST may include second read level offset information corresponding to the detection information OVSDI. The detection information OVSDI may be development time information corresponding to an optimal distribution valley. The second read level offset information may include read level offset information corresponding to develop time information in which the OVS operation is performed. Accordingly, the OVST may be a table obtained by converting the detection information OVSDI to the read level offset information.

The HRT may include third read level offset information related to a history read operation. In the example embodiment, the third read level offset information may include information obtained by accumulating the second read level offset information.

In another example embodiment, the third read level offset information may be determined using the first read level offset information and the second read level offset information. The third read level offset information may include an optimal read level for performing a history read operation. The history read operation are described in detail in U.S. Pat. Nos. 10,120,589, and 10,373,693, which are incorporated herein by reference.

The ECC circuit 230 may be implemented to generate an error correction code in a program operation and to recover data using the error correction code in a read operation. The ECC circuit 230 may generate an error correction code (ECC) for correcting a failure bit or an error bit of the data received from the non-volatile memory device 100. The ECC circuit 230 may form data to which a parity bit is added by performing error correction encoding of data provided to the non-volatile memory device 100. The parity bit may be stored in the non-volatile memory device 100. Also, the ECC circuit 230 may perform the error correction decoding on the data output from the non-volatile memory device 100. The ECC circuit 230 may correct an error using parity. The ECC circuit 230 may correct an error using a low density parity check (LDPC) code, a BCH code, a turbo code, a Reed-Solomon code, a convolution code, a recursive systematic code (RSC), and a coded modulation such as trellis-coded modulation (TCM) and block coded modulation (BCM).

When the error correction is impossible in the error correction circuit 230, a read retry operation may be performed. In the example embodiment, the read retry operation may include the OVS operation. In another example embodiment, the read retry operation may include an OVS operation reflected with the PDT.

The storage device 10 in the example embodiment may not perform the OVS operation before an uncorrectable error correction code (UECC) occurs, and may activate the OVS operation only after the UECC occurs. Also, the storage device 10 in the example embodiment may reflect the detection information OVSDI on the HRT in real time regardless of a failure or success of the OVS operation, such that the distribution valley may be searched for more swiftly in the next OVS operation.

Figure 2:
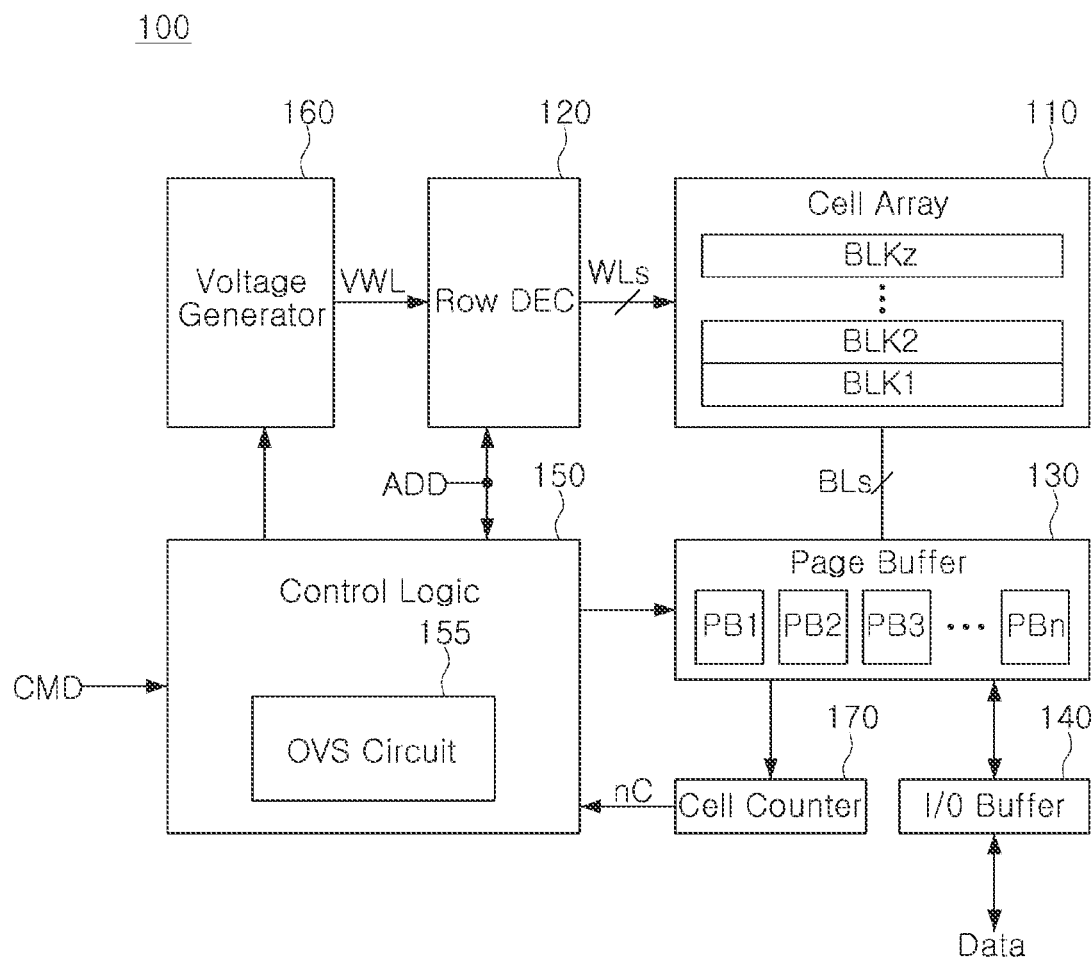
FIG. 2 is a diagram illustrating a non-volatile memory device illustrated in FIG. 1 according to an example embodiment of the present disclosure.

FIG. 2 is a diagram illustrating a non-volatile memory device 100 illustrated in FIG. 1 according to an example embodiment. Referring to FIG. 2, the non-volatile memory device 100 may include a memory cell array 110, a row decoder 120, a page buffer circuit 130, an input and output buffer circuit 140, a control logic 150, a voltage generator 160, and a cell counter 170.

The memory cell array 110 may be connected to the row decoder 120 through wordlines WLs or select lines SSL and GSL. The memory cell array 110 may be connected to the page buffer circuit 130 through bitlines BLs. The memory cell array 110 may include a plurality of cell strings. Channels of each of the cell strings may be formed in a vertical or horizontal direction. Each of the cell strings may include a plurality of memory cells. The plurality of memory cells may be programmed, erased, or read by a voltage provided to the bitlines BLs or the wordlines WLs. Generally, a program operation may be performed by page unit, and an erase operation may be performed by block unit. The memory cells are described in detail in U.S. Pat. Nos. 7,679,133, 8,553,466, 8,654,587, 8,559,235, and 9,536,970, which are incorporated herein by reference. In the example embodiment, the memory cell array 110 may include a 2D memory cell array and the 2D memory cell array may include a plurality of NAND strings arranged in a row direction and a column direction.

The row decoder 120 may be implemented to select one of the memory blocks BLK1 to BLKz of the memory cell array 110 in response to the address ADD. The row decoder 120 may select one of the wordlines of the selected memory block in response to the address ADD. The row decoder 120 may transfer the wordline voltage VWL corresponding to an operation mode to the wordline of the selected memory block. In the program operation, the row decoder 120 may apply a program voltage and a verify voltage to the selected wordline and may apply a pass voltage to the unselected wordline. In a read operation, the row decoder 120 may apply a read voltage to a selected wordline and may apply a read pass voltage to an unselected wordline.

The page buffer circuit 130 may be implemented to operate as a write driver or a sense amplifier. In the program operation, the page buffer circuit 130 may apply a bitline voltage corresponding to data to be programmed to the bitlines of the memory cell array 110. In the read operation or a verify read operation, the page buffer circuit 130 may detect data stored in the selected memory cell through the bitline BL. Each of the plurality of page buffers PB1 to PBn (n is an integer equal to or greater than 2) included in the page buffer circuit 130 may be connected to at least one bitline.

Each of the plurality of page buffers PB1 to PBn may be implemented to perform sensing and latching for performing the OVS operation. Each of the plurality of page buffers PB1 to PBn may perform a plurality of sensing operations to identify one of states stored in the selected memory cells under the control of the control logic 150. Also, each of the plurality of page buffers PB1 to PBn may store data sensed through the plurality of sensing operations and may select one data under the control of the control logic 150. Each of the plurality of page buffers PB1 to PBn may perform the sensing multiple times to identify one of the states. Also, each of the plurality of page buffers PB1 to PBn may select or output optimal data from among a plurality of pieces of data sensed under the control of the control logic 150.

The input and output buffer circuit 140 may provide data provided from an external entity to the page buffer circuit 130. The input and output buffer circuit 140 may provide a command CMD provided from an external entity to the control logic 150. The input and output buffer circuit 140 may provide an address ADD provided from an external entity to the control logic 150 or the row decoder 120. Also, the input and output buffer circuit 140 may output data (Data) sensed and latched by the page buffer circuit 130 to an external entity.

The control logic 150 may be implemented to control the row decoder 120 and the page buffer circuit 130 in response to a command CMD transmitted from an external entity.

Also, the control logic 150 may include an OVS circuit 155 to perform an OVS operation.

The OVS circuit 155 may control the page buffer circuit 130 and the voltage generator 160 for the OVS operation. The OVS circuit 155 may control the page buffer circuit 130 to perform a plurality of sensing operations to identify specific states of selected memory cells. Also, the OVS circuit 155 may control the plurality of page buffers PB1 to PBn to store the sensing data corresponding to each of the plurality of sensing results in a plurality of latch sets provided in each of the plurality of page buffers PB1 to PBn. Also, the OVS circuit 155 may perform processing for selecting optimal data from among a plurality of pieces of sensed data. To select optimal data, the OVS circuit 155 may refer to a count result nC provided from the cell counter 170. The OVS circuit 155 may control the page buffer circuit 130 to select and output a read result closest to the distribution valley among the plurality of sensing results.

Also, the OVS circuit 155 may store develop time information corresponding to the OVS operation. The OVS circuit 155 may output the stored develop time information as detection information OVSDI to the controller 200. In the example embodiment, the detection information OVSDI may be output using a UIB out or may be output in response to a specific command (e.g., a get feature command, a status read command, or the like).

The voltage generator 160 may be implemented to generate various types of wordline voltages to be applied to respective wordlines under the control of the control logic 150 and a well voltage to be supplied to a bulk (e.g., a well region) in which memory cells are formed. The wordline voltages applied to each of the wordlines may include a program voltage, a pass voltage, a read voltage, and a read pass voltage.

The cell counter 170 may be implemented to count memory cells corresponding to a specific threshold voltage range from data sensed by the page buffer circuit 130. For example, the cell counter 170 may count the number of memory cells having a threshold voltage in a specific threshold voltage range by processing data sensed in each of the plurality of page buffers PB1 to PBn.

The non-volatile memory device 100 in an example embodiment may perform an OVS operation simultaneously while entering a recovery code, thereby securing reliability of a read operation. Also, even when the OVS operation fails, the non-volatile memory device 100 in the example embodiment may output the detection information OVSDI to the controller 200, such that the read level search operation may be performed swiftly in a next OVS operation.

Figure 3:
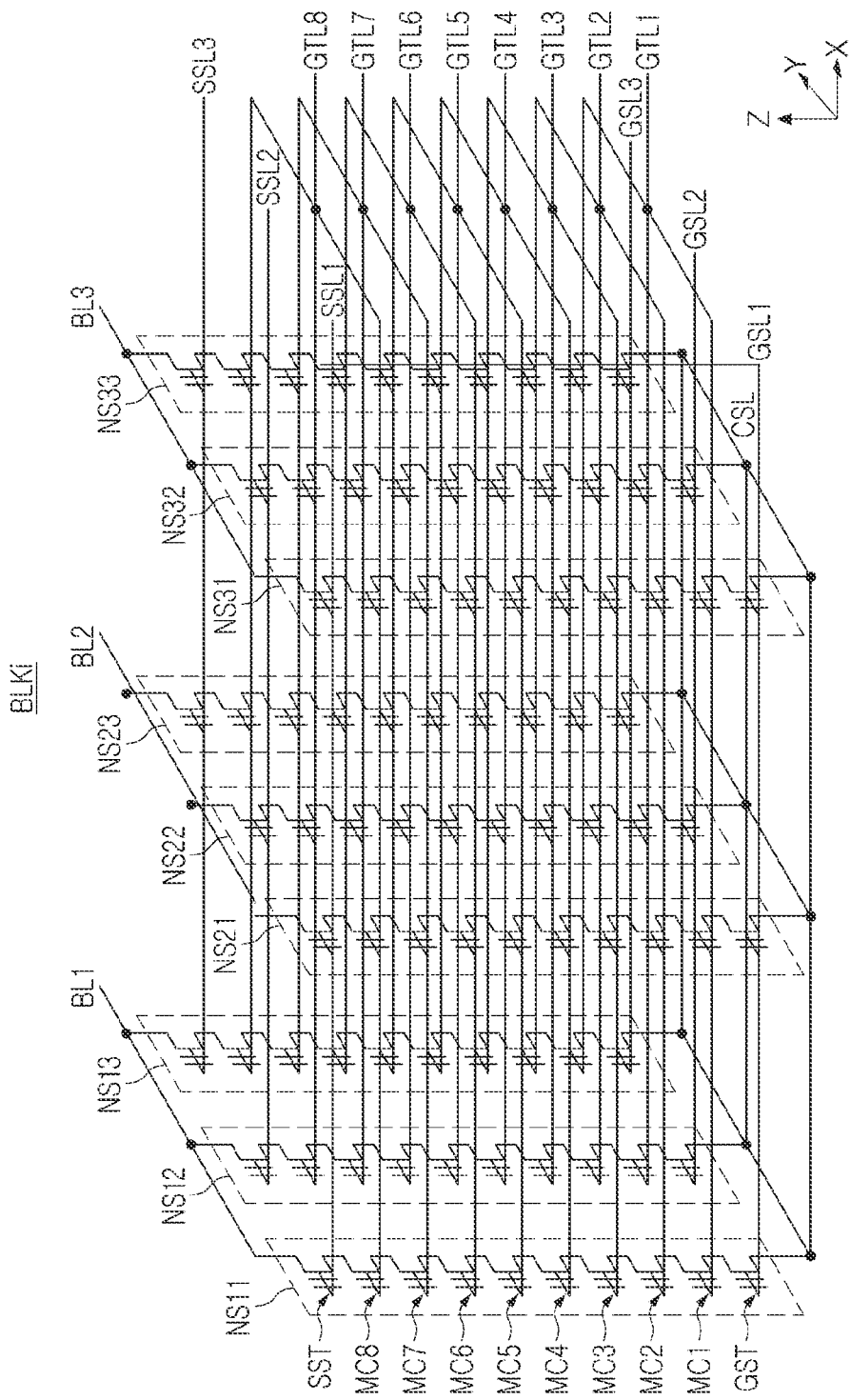
FIG. 3 is a circuit diagram illustrating one memory block of memory blocks illustrated in FIG. 1.

FIG. 3 is a circuit diagram illustrating a memory block BLKi (i is an integer equal to or greater than 2) according to an example embodiment. A plurality of memory NAND strings included in the memory block BLKi may be formed in a direction perpendicular to the substrate.

Referring to FIG. 3, the memory block BLKi may include a plurality of memory NAND strings NS11 to NS33 connected between bitlines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. In FIG. 3, each of the plurality of memory NAND strings NS11 to NS33 may include eight memory cells MC1, MC2, . . . , MC8, but an example embodiment thereof is not limited thereto.

The string selection transistor SST may be connected to the corresponding string select lines SSL1, SSL2, and SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to wordlines, and a portion of the gate lines GTL1, GTL2, . . . , GTL8 may correspond to dummy wordlines. The ground selection transistor GST may be connected to the corresponding ground select lines GSL1, GSL2, and GSL3. The string select transistor SST may be connected to the corresponding bitlines BL1, BL2, and BL3, and the ground select transistor GST may be connected to the common source line CSL.

Wordlines (e.g., WL1) having the same height may be connected in common, and ground select lines GSL1, GSL2, and GSL3 and string select lines SSL1, SSL2, and SSL3 may be isolated from each other. In FIG. 3, the memory block BLKi may be connected to the eight gate lines GTL1, GTL2, . . . , GTL8 and the three bitlines BL1, BL2, and BL3, but an example embodiment thereof is not limited thereto.

Figure 4:
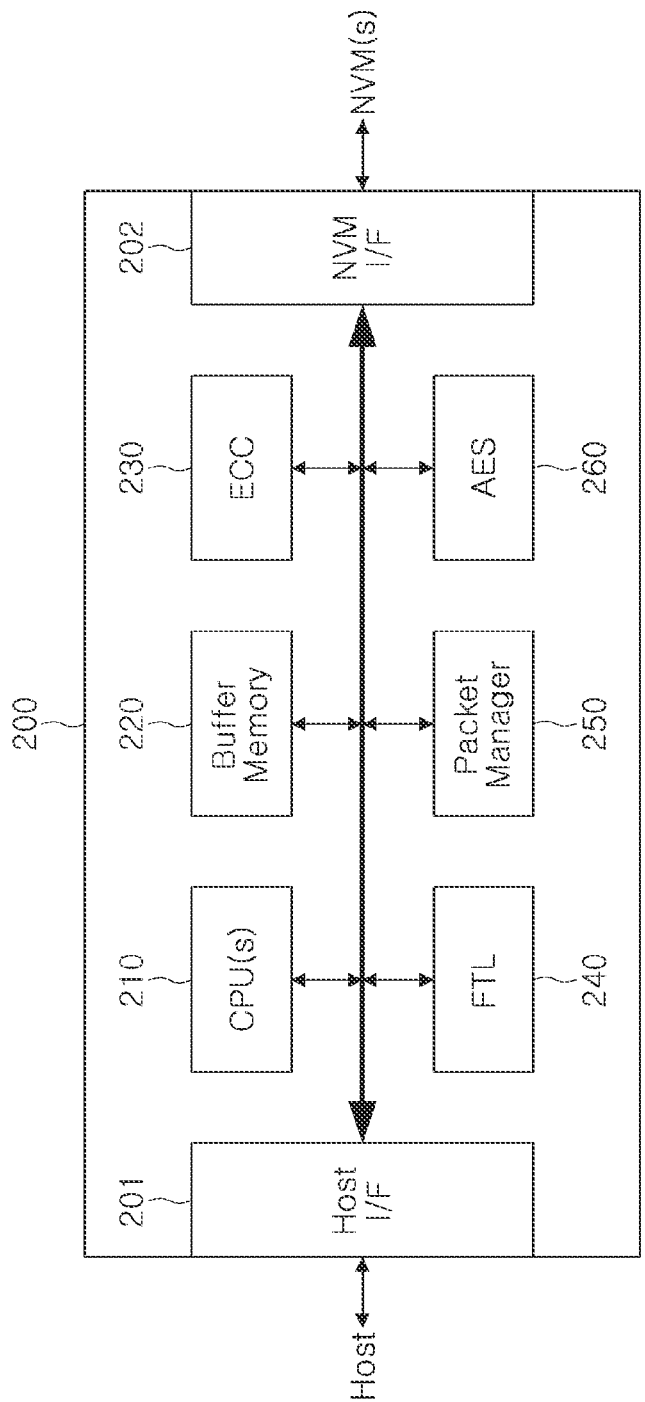
FIG. 4 is a diagram illustrating a controller according to an example embodiment of the present disclosure.

FIG. 4 is a diagram illustrating a controller 200 according to an example embodiment. Referring to FIG. 4, the controller 200 may include a host interface 201, a memory interface 202, at least one CPU 210, a buffer memory 220, an error correction circuit 230, a flash conversion layer (FTL) manager 240, a packet manager 250, and an encryption device 260.

The host interface 201 may be implemented to transmit a packet to and receive a packet from a host. A packet transmitted from the host to the host interface 201 may include a command or data to be written in the non-volatile memory 100. A packet transmitted from the host interface 201 to the host may include a response for a command or data read from the non-volatile memory 100. The memory interface 202 may transmit data to be written in the non-volatile memory 100 to the non-volatile memory 100 or may receive data read from the non-volatile memory 100. The memory interface 202 may be implemented to comply with standard conventions such as JDEC Toggle or ONFI.

The flash translation layer manager 240 may perform various functions, such as address mapping, wear-leveling, and garbage collection. The address mapping operation may be an operation of converting a logical address received from a host into a physical address used to actually store data in the non-volatile memory 100. The wear-leveling may be a technique for preventing excessive deterioration of a specific block by allowing blocks in the non-volatile memory 100 to be used evenly. For example, the wear-leveling may be implemented by a firmware technology that balances erase counts of physical blocks. The garbage collection is a technique for securing usable capacity in the non-volatile memory 100 by copying valid data of a block to a new block and erasing the existing block.

The packet manager 250 may generate a packet according to a protocol of an interface negotiated with the host or may parse various information from a packet received from the host. Further, the buffer memory 216 may temporarily store data to be written in the non-volatile memory 100 or data read from the non-volatile memory 100. In the example embodiment, the buffer memory 220 may be configured to be included in the controller 200. In another example embodiment, the buffer memory 220 may be disposed externally of the controller 200.

The encryption device 260 may perform at least one of an encryption operation and a decryption operation for data input to the storage controller 210 using a symmetric-key algorithm. The encryption device 260 may encrypt and decrypt data using an advanced encryption standard (AES) algorithm. The encryption device 260 may include an encryption module and a decryption module.

Figure 5A:
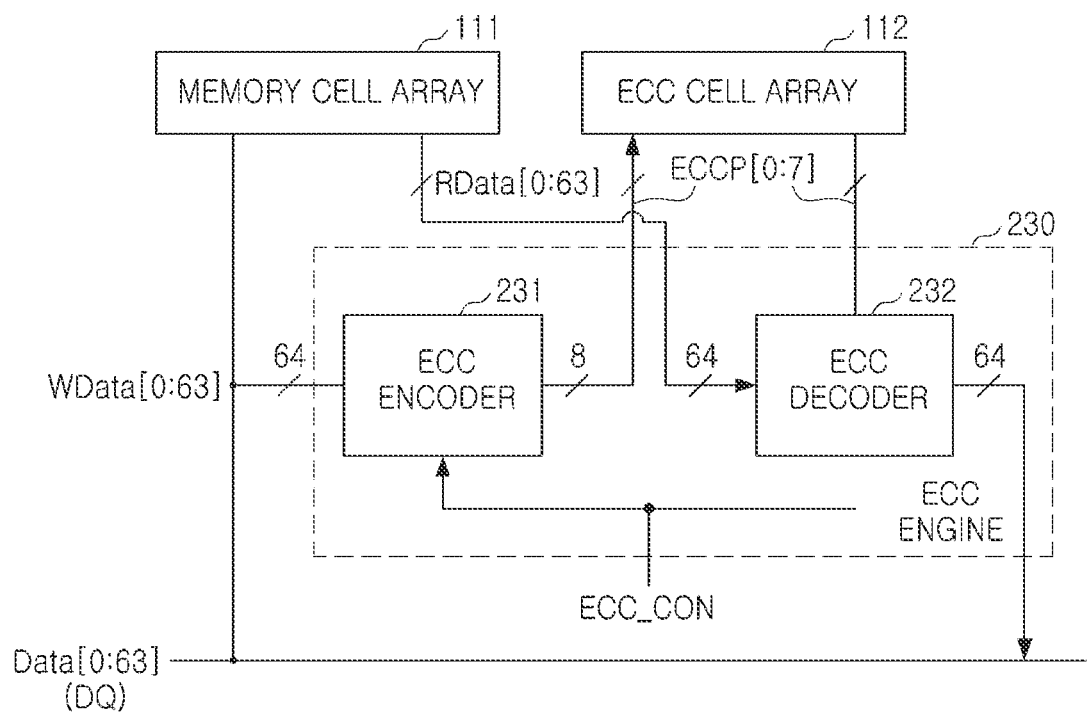
FIGS. 5A, 5B, and 5C are diagrams illustrating an error correction circuit of a controller according to an example embodiment of the present disclosure.
Figure 5B:
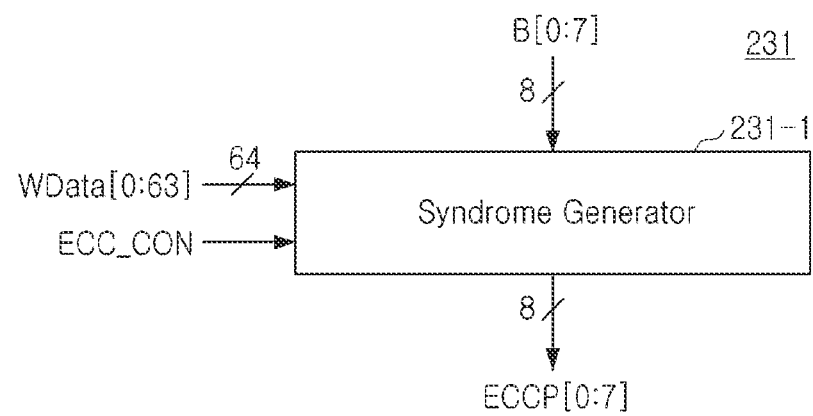
Figure 5C:
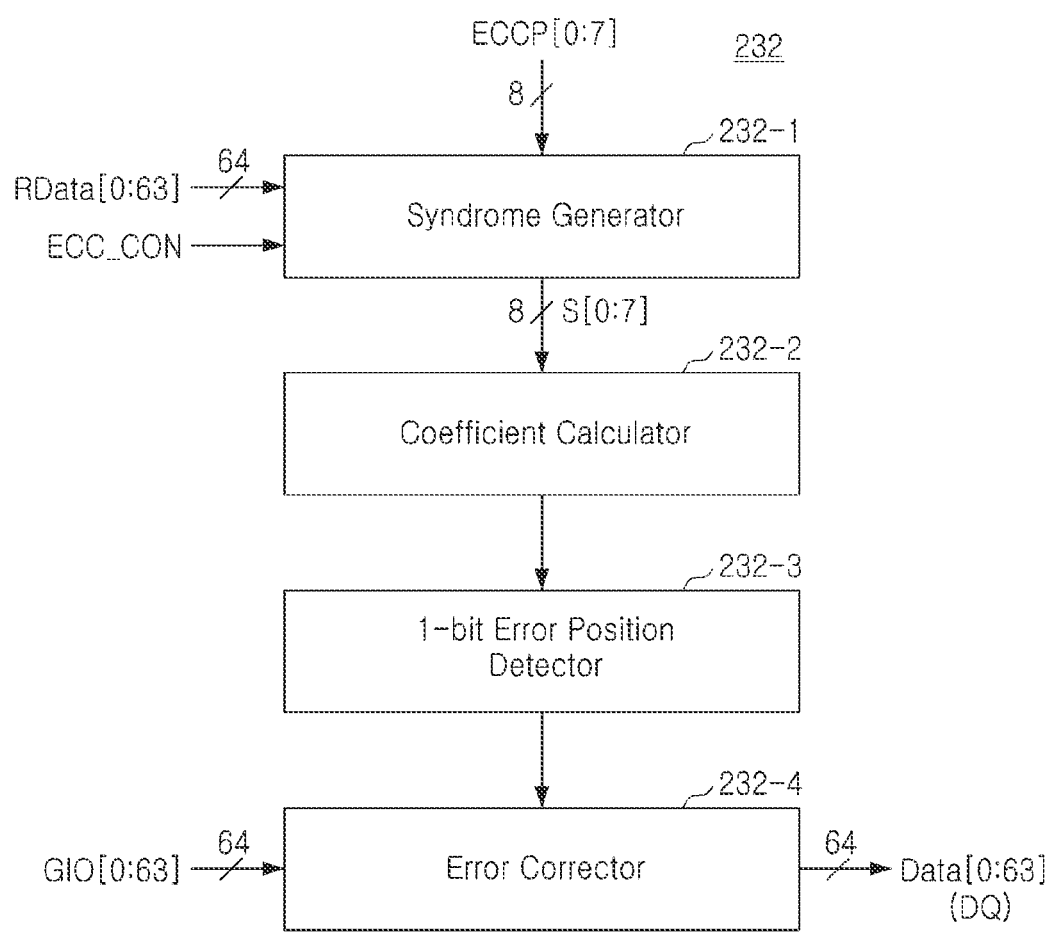

FIGS. 5A, 5B, and 5C are diagrams illustrating an error correction circuit 230 of a controller 200 according to an example embodiment.

Referring to FIG. 5A, the error correction circuit (ECC) 230 may include an ECC encoding circuit 231 and an ECC decoding circuit 232. The ECC encoding circuit 231 may generate parity bits ECCP[0:7] for data WData[0:63] to be written in the memory cells of the memory cell array 111 in response to the ECC control signal ECC_CON. The parity bits ECCP[0:7] may be stored in the ECC cell array 112. In the example embodiment, the ECC encoding circuit 231 may generate parity bits ECCP[0:7] for data WData[0:63] to be written in memory cells including defective cells in response to the ECC control signal ECC_CON.

The ECC decoding circuit 232 may correct error bit data using data RData[0:63] read from the memory cells of the memory cell array 111 and parity bits ECCP[0:7] read from the ECC cell array 120 in response to the ECC control signal ECC_CON and may output the error-corrected data[0:63]. In the example embodiment, the ECC decoding circuit 232 may correct error bit data using the data (RData[0:63]) read from memory cells including bad cells and the parity bits ECCP[0:7] read from the ECC cell array 120 in response to the ECC control signal ECC_CON and may output the error-corrected data (Data[0:63]).

Referring to FIG. 5B, the ECC encoding circuit 231 may include a syndrome generator 231-1 configured to receive 64-bit write data WData[0:63] and basis bits B[0:7] in response to the ECC control signal ECC_CON and to generate parity bits ECCP[0:7], a syndrome, using an XOR array operation. The basis bits B[0:7] may be configured to generate parity bits ECCP[0:7] for the write data WData[0:63] and may be formed of b'00000000 bits, for example. The basis bit (B[0:7]) may use other specific bits instead of b'00000000 bits.

Referring to FIG. 5C, the ECC decoding circuit 232 may include the syndrome generator 232-1, a coefficient calculator 232-2, a 1-bit error position detector 232-3, and an error corrector 232-4. The syndrome generator 232-1 may receive 64-bit read data RData[0:63] and 8-bit parity bits (ECCP[0:7]) in response to the ECC control signal ECC_CON and may generate syndrome data S[0:7] using an XOR array calculation. The coefficient calculator 232-2 may calculate a coefficient of an error position equation using syndrome data S[0:7]. The error position equation may be based on a reciprocal of the error bit. The 1-bit error position detector 232-3 may calculate the position of the 1-bit error using the calculated error position equation. The error corrector 232-4 may determine the position of a 1-bit error based on the result of detection of the 1-bit error position detector 232-3. The error corrector 232-4 may correct the error by inverting a logic value of the bit in which an error occurred among 64-bit read data RData[0:63] according to the determined position information of 1-bit error and may output the error-corrected 64-bit data[0:63].

Figure 6:
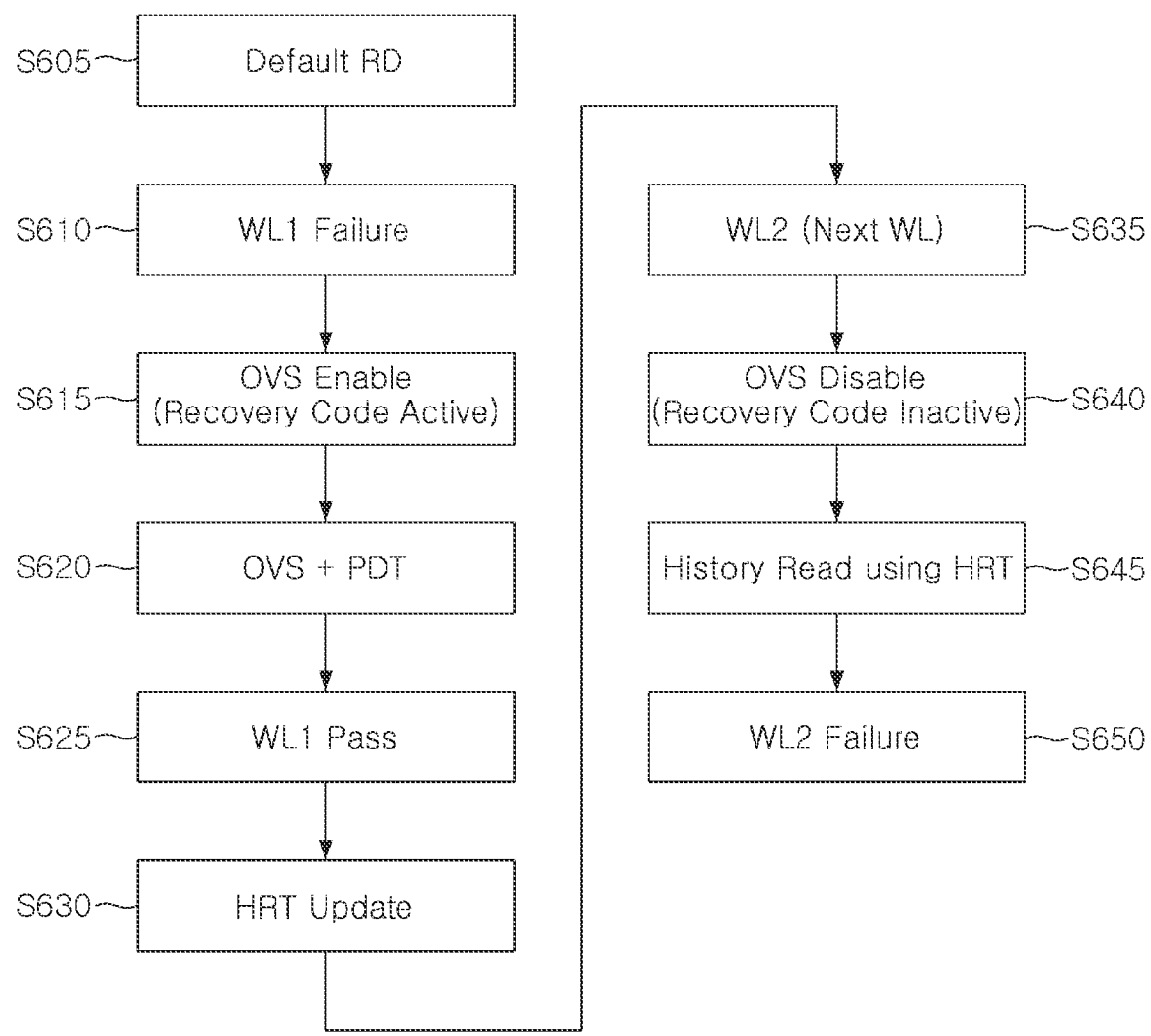
FIG. 6 is a flowchart illustrating an example of a process of performing a read operation using an OVS in a related-art storage device.

FIG. 6 is a flowchart illustrating an example of a process of performing a read operation using OVS in a related-art storage device. It may be assumed that a read operation may be performed on the memory cells connected to a first wordline WL1 using a default read level (S605). When the read operation fails (S610), the OVS operation for the memory cells connected to the first wordline WL1 may be activated (S615). The non-volatile memory device may enter a recovery code (S615). The OVS operation may be performed by reflecting a predefined table (PDT) (S620). When the read operation for the memory cells connected to the first wordline WL1 passes the OVS operation (S625), the history read table (HRT) may be updated (S630). In this case, offset information of the PDT used for the OVS operation may be updated to the HRT.

Thereafter, when a read operation is performed on the memory cells connected to a subsequent wordline (S635), a second wordline WL2, for example, the OVS operation may be deactivated (S640). In other words, a read operation may be performed on the memory cells connected to the second wordline WL2 in a state in which the recovery code is released. In this case, a history read operation may be performed using the updated HRT (S645). In the related-art storage device, since an optimum read level offset searched in the OVS operation is not reflected in the HRT, it may be highly likely that a read operation of memory cells connected to the subsequent wordline may be failed (S650).

The storage device 10 in the example embodiment may reflect detection information OVSDI (see FIG. 1) in the history read level table (HRT) regardless of a success or failure of the OVS operation, such that an optimum read level may be used in the subsequent read operation (the OVS operation or a normal read operation).

Figure 7:
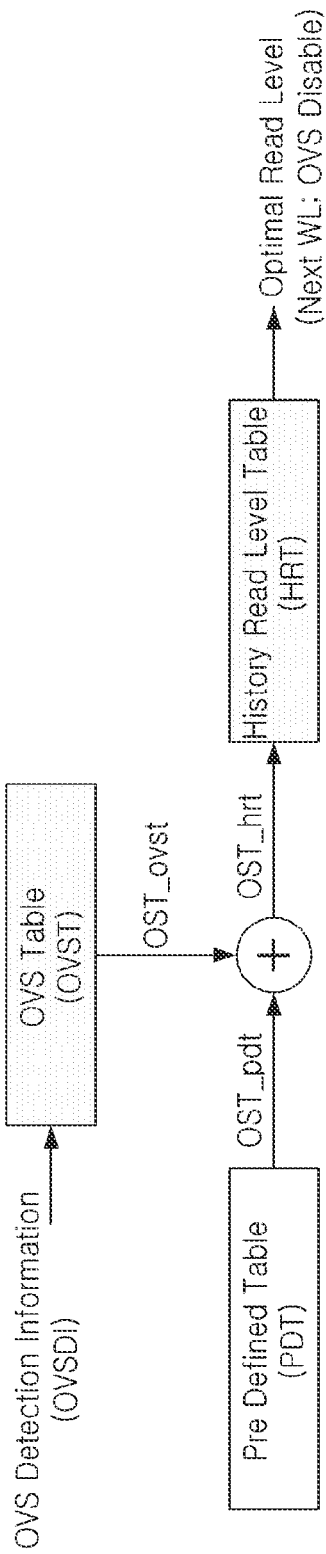
FIG. 7 is a diagram illustrating a process of extracting a read level according to an OVS operation in a storage device according to an example embodiment of the present disclosure.

FIG. 7 is a diagram illustrating a process of extracting a read level according to an OVS operation in a storage device 100 according to an example embodiment. Referring to FIG. 7, the storage device 10 may extract an optimal read level by updating an HRT (a second table) in real time using a PDT (a third table) or an OVST (a first table).

The detection information OVSDI (see FIG. 1) may include result information according to the OVS operation. The second read level offset OST_ovst corresponding to the detection information may be reflected in the OVST in real time.

In the example embodiment, the third read level offset OST_hrt may be determined by accumulating the second read level offset OST_ovst.

In another example embodiment, the third read level offset OST_hrt may be determined by adding the second read level offset OST_ovst to the first read level offset OST_pdt according to the lapse of the programming time. It should not be understood that the third read level offset OST_hrt may be determined only by a simple addition of the first read level offset OST_pdt or the second read level offset OST_ovst. Also, the third read level offset OST_hrt may be added by applying a weight to each of the first and second read level offsets OST_pdt and OST_ovst.

The storage device 10 in the example embodiment may reflect the read level offset OST_ovst to the HST regardless of a failure of the OVS operation, such that the optimum read level may be swiftly searched for in the next OVS operation.

Generally, the sensing of a sensing node of a page buffer several times during the time in which develop time is varied has an effect the same as precharging and sensing a bitline by varying a wordline voltage.

Figure 8A:
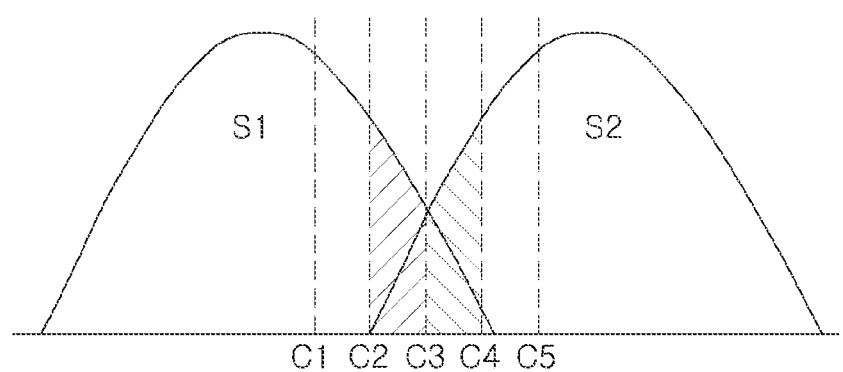
FIGS. 8A and 8B are diagrams illustrating different read levels of a distribution valley and develop times corresponding to the read levels.
Figure 8B:
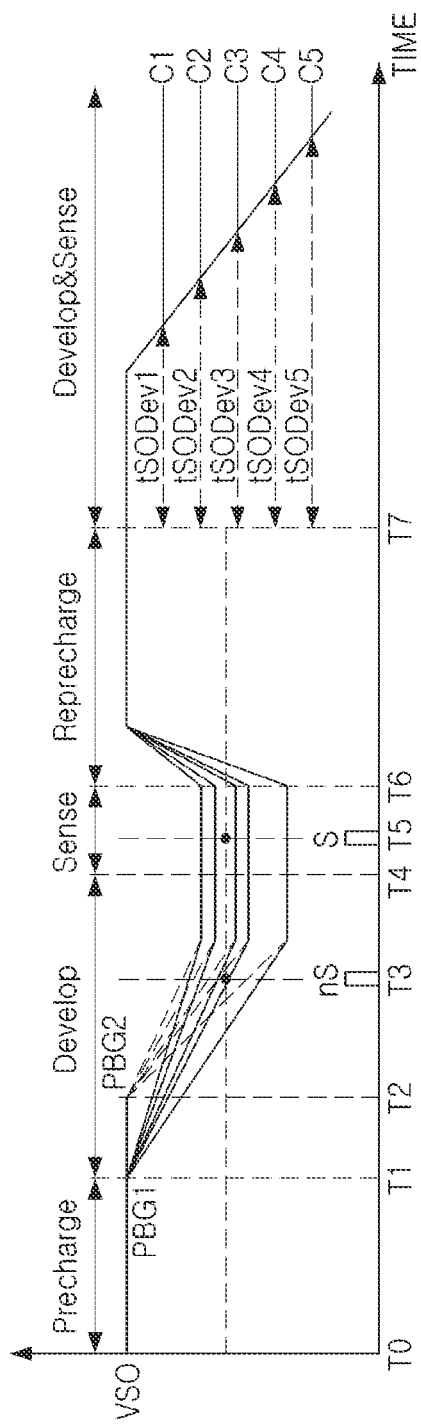

FIGS. 8A and 8B are diagrams illustrating different read levels of a distribution valley and develop times corresponding to the read levels. As illustrated in FIG. 8A, the OVS operation for searching for a distribution valley of states S1 and S2 may be performed by a plurality of sensing operations. The plurality of sensing operations may be simultaneously performed in each of a plurality of page buffer groups.

Referring to FIG. 8B, an on-chip valley search operation may be performed by sequentially latching a sensing node to the first page buffers PGB1 and the second page buffers PGB2 at the same time points during different development periods and storing the sensing result.

The precharge operation may be performed from the time point T0 to a time point T1. For the precharging, a first bitline and a first sensing node connected to each of the first page buffers PBG1 may be charged. When the bitline set-up signals are activated, the sensing node and the first bitline may be precharged to a specific level. When the first bitline set-up signal is deactivated to a high level at the time point T1, each of precharge circuits of the first page buffers PBG1 may be turned off. Also, when the second bitline set-up signal is deactivated to a high level at a time point T2 after the time point T1, each precharge circuit of the second page buffers PBG2 may be turned off. In this case, the level of each sensing node of the first page buffers PBG1 and the level of each sensing node of the second page buffers PBG2 may change according to a magnitude of a current flowing to a corresponding bitline according to whether the memory cell is turned on or off.

As illustrated in FIG. 8B, each of the first page buffers PBG1 may precharge a sensing node from a time point T0 to a time point T1, and may develop first bitlines from the time point T1 to a time point T4. Each of the second page buffers PBG2 may precharge the sensing node from the time point T0 to the time point T1 and may develop the second bitlines from the time point T2, later than the time point T1, to the time point T4.

The first sensing operation may include a latch reset (nS) sensing operation performed at a time point T3 and a latch set (S) sensing operation at a time T5. The first cell count information may be calculated using on-cell count values of the latch reset (nS) sensing operation and the latch set (S) sensing operation in first page buffers PGB1. Also, the second cell count information may be calculated using on-cell count values of the latch reset (nS) sensing operation and the latch set (S) sensing operation in second page buffers PGB2. A detection case (one of C1 to C5) which may correspond to an optimal read level corresponding to the distribution valley may be determined based on the first and second cell count information of the first sensing operation. Further, develop times tSODev1 to tSODev5 of the second sensing operation corresponding to the determined detection case may be determined.

Figure 9:
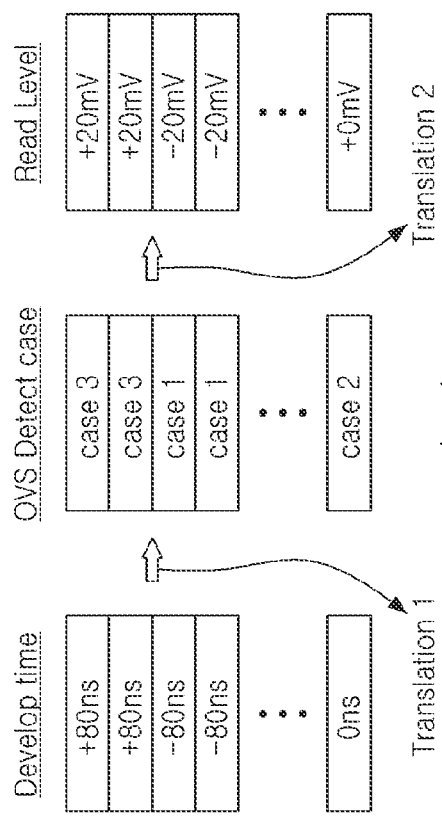
FIG. 9 is a diagram illustrating a process of correcting a read level using an OVS table (OVST) according to an example embodiment of the present disclosure.

FIG. 9 is a diagram illustrating a process of correcting a read level using an OVS table (OVST) according to an example embodiment.

An offset of a develop time corresponding to an optimal distribution valley according to an OVS operation may be determined. As for an uppermost page, an offset of the develop time is +80 ns. In this case, the detection case of the OVS operation may correspond to the third detection case C3. The OVS circuit 155 (see FIG. 1) of the non-volatile memory device 100 (see FIG. 1) may perform a first conversion operation for a detection case corresponding to an optimal develop time of the OVS operation. The OVS circuit 155 may store or latch data bit for each detection case.

Thereafter, the detection information OVSDI (see FIG. 1) may be output from the non-volatile memory device 100 to the controller 200 (see FIG. 1). The controller 200 may generate an OVST of a corresponding read level offset (+20 mV) using the detection information, an OVS detection case C3. In this case, the controller 200 may perform a second conversion operation on the read level corresponding to the OVS detection case using the OVST. Accordingly, the controller 200 may update the HRT with the offset according to the OVS operation.

Figure 10:
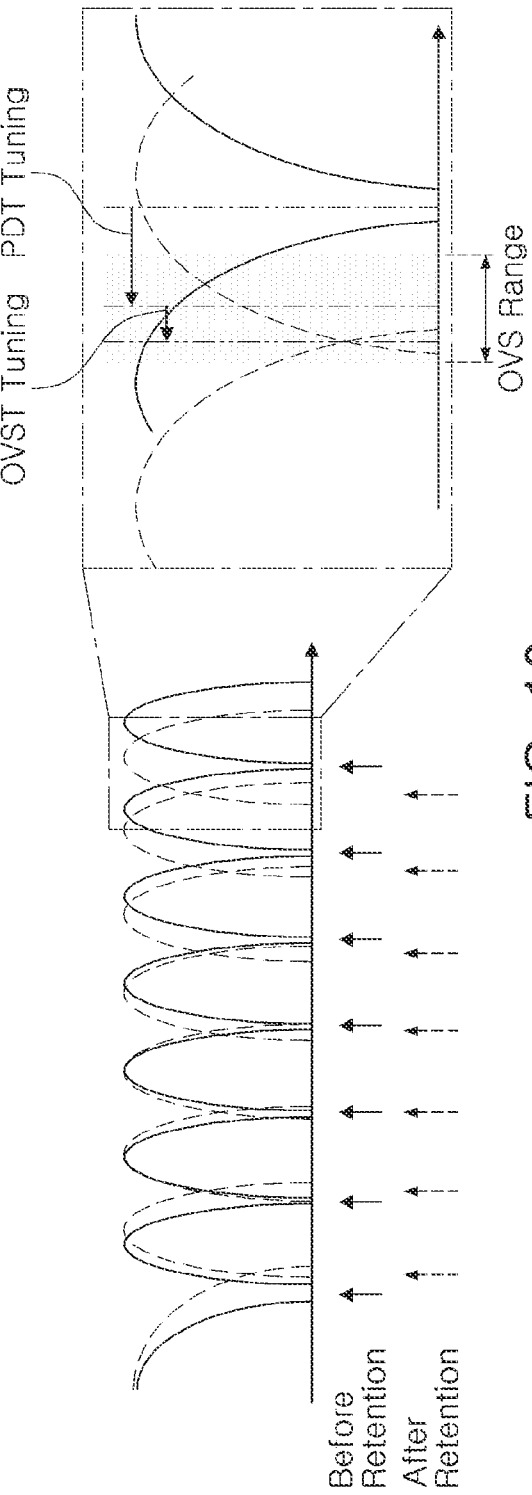
FIG. 10 is a diagram illustrating a process of searching for an optimal distribution valley according to an OVS operation using a PDT in a general storage device.

FIG. 10 is a diagram illustrating a process of searching for a distribution valley according to an OVS operation using a PDT in a related-art storage device. Referring to FIG. 10, the storage device 10 may perform coarse tuning on the read level using a PDT and may perform fine tuning on the read level using an OVST.

When an OVS recovery code using the first PDT fails, a related-art storage device may perform the OVS recovery code using a second PDT. The second PDT may be different from the first PDT. Also, the HRT may be updated only when the read operation is finally passed. Therefore, the failed detection information may not be stored anywhere. Adding a new PDT to a next OVS recovery code since the first OVS recovery code fails may be a burden in the aspect of firmware management.

The storage device 10 in the example embodiment may extend an error correction range without adding a new PDT to the next OVS recovery code even when the first OVS recovery code fails. For example, even when the first OVS recovery code fails, the storage device 10 may reflect the failed detection information in the HRT and may perform the next OVS recovery code using the reflected HRT without adding a new PDT. In other words, the HRT reflected in real time may perform an additional PDT function regardless of whether the OVS operation fails.

Even when the OVS recovery code fails, the storage device 10 in the example embodiment may perform the next OVS recovery code by reflecting the detected distribution information, the detection information OVSDI.

The storage device 10 in the example embodiment may perform the OVS recovery code without using the PDT.

Figure 11:
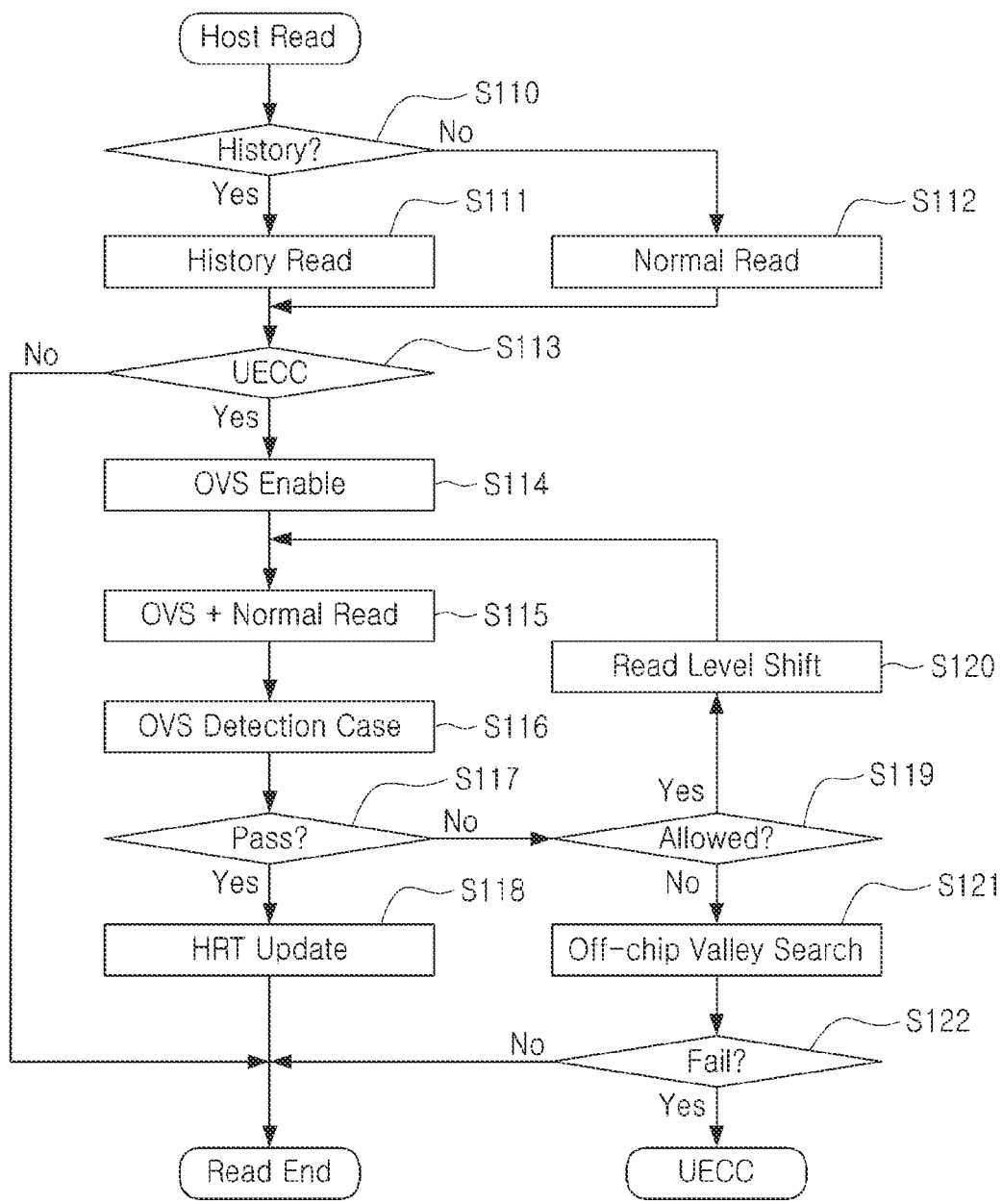
FIG. 11 is a flowchart illustrating a reading method of a storage device according to an example embodiment of the present disclosure.

FIG. 11 is a flowchart illustrating a reading method of a storage device 10 according to an example embodiment. Referring to FIGS. 1 to 11, a read operation of the storage device 10 may be performed as follows.

A read request may be received from a host (external) to the storage device 10. The storage device 10 may determine a history of the read request. It may be determined whether a read request currently received from the history buffer has been previously presented (S110). When the current read request is present among previous read requests stored in the history buffer, a history read operation may be performed (S111). In the history read operation, the read operation may be performed at an optimum read level included in the history read level table HRT. When no current read request is present among the previous read requests stored in the history buffer, a normal read operation may be performed (S112). In the normal read operation, the read operation may be performed at a default read level.

As a result of the history read operation or the normal read operation, it may be determined whether an UECC occurs (S113). The UECC indicates that the read data may not be recovered by the ECC circuit 130 (see FIG. 1). When UECC does not occur, the read operation may be terminated immediately.

When the UECC has occurred, the device may enter the OVS recovery code. Basically, the OVS mode may be activated (S114), and the non-volatile memory device 100 (see FIG. 1) may perform a read retry operation according to the OVS mode. The read retry operation may include a normal read operation using a default read level and a read operation using an OVS operation. In other words, by performing the OVS operation using the default read level of the normal read operation, the read retry operation may be performed (S115).

Offset information corresponding to the OVS detection case may be determined regardless of success/failure of the read retry operation (S116).

Thereafter, it may be determined whether the read retry operation is passed (S117). As a result of the determination, when the read retry operation is passed, the history read level table HRT reflected with offset information corresponding to the detection case may be updated using an OVST (S118).

When the read retry operation is a failure, it may be determined whether the next OVS operation is allowed (S119). Whether to allow the next OVS operation may correspond to the number of times the OVS operation is performed. For example, when the number of times the OVS operation is performed does not exceed a reference value, a next OVS operation may be allowed. When the next OVS operation is allowed, the default read level may be changed to correspond to the OVS detection case (S120). Thereafter, operation S115 may be performed.

When the next OVS operation is not allowed, an off-chip valley search operation may be performed for data recovery (S121). The off-chip valley search refers to searching for a distribution valley by sequentially scanning a predetermined voltage section while increasing or decreasing the predetermined voltage section by a predetermined voltage. The read operation may be performed according to the distribution valley according to the off-chip valley search operation, and it may be determined whether the result of the read operation has failed (S122). When the result did not fail, the read operation may be completed. When the read operation fails, a UECC may be finally generated for a read request from the host. The generated UECC may be output to the host.

Figure 12:
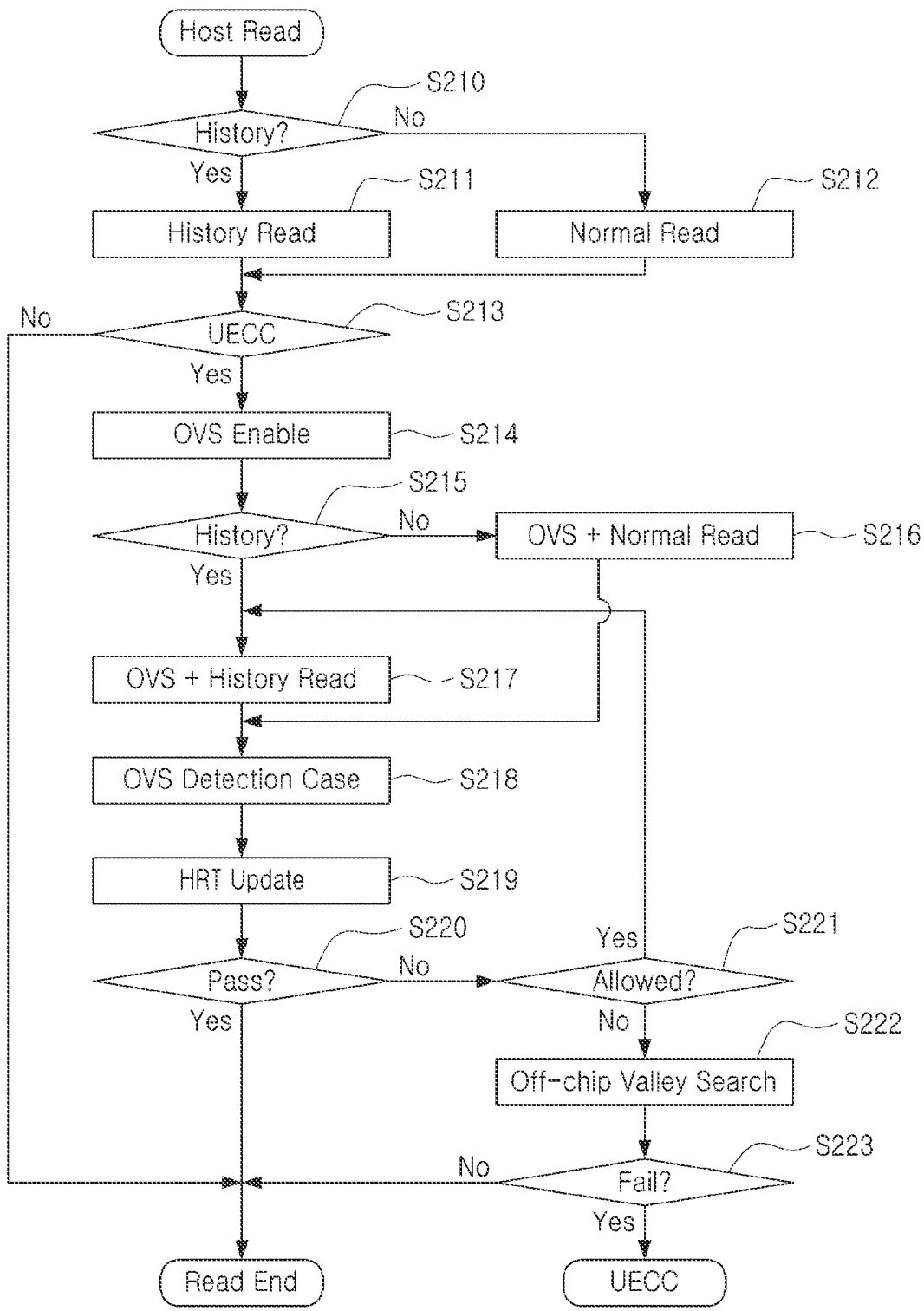
FIG. 12 is a flowchart illustrating a reading method of a storage device according to an example embodiment of the present disclosure.

FIG. 12 is a flowchart illustrating a reading method of a storage device 10 according to an example embodiment. Referring to FIGS. 1 to 10 and 12, a read operation of the storage device 10 may be performed as follows.

The storage device 10 may determine whether a read request currently received from a history buffer has been previously presented (S210). When the current read request is present among previous read requests stored in the history buffer, a history read operation may be performed (S211). When no current read request is present among previous read requests stored in the history buffer, a normal read operation may be performed (S212).

As a result of the history read operation or the normal read operation, it may be determined whether a UECC occurs (S213). When the UECC does not occur, the read operation may be immediately terminated. When the UECC occurs, the device may enter the OVS recovery code. Basically, the OVS mode may be activated (S214) and it may be determined whether a read request has been presented in the history buffer before (S215).

When no read request is present in the history buffer, the volatile memory device 100 (see FIG. 1) may perform the OVS operation using the default read level of the normal read operation (S216) and may enter operation S218. When a read request is present the history buffer, the non-volatile memory device 100 may perform the OVS operation using the history read level of the history read operation (S217).

The OVS detection case may be determined regardless of a success/failure of the OVS operation (S218). Detection information corresponding to the determined OVS detection case may be output to the controller 200, and the HRT may be updated (S219).

Thereafter, it may be determined whether the OVS read retry operation has passed (S220). As a result of the determination, when the OVS read retry operation has passed, the read operation may be completed.

When the OVS read retry operation fails, it may be determined whether the next OVS operation is allowed (S221). When the next OVS operation is allowed, operation S217 (the OVS operation using the history read level) may be performed.

When the next OVS operation is not allowed, an off-chip valley search operation may be performed (S222). The read operation may be performed according to a distribution valley according to the off-chip valley search operation, and it may be determined whether the result of performing the read operation has failed (S223). When the read operation has not failed, the read operation may be completed. When the read operation fails, a UECC may be finally generated for a read request from the host.

FIGS. 13A, 13B, 13C, and 13D are diagrams illustrating a process of updating offset data of HRT in a read operation of a storage device according to an example embodiment.

As illustrated in FIG. 13A, it may be assumed that an OVST may include seven detection cases C1 to C7 corresponding to seven read levels R1 to R7, respectively. Also, it may be assumed that the OVS operation has been firstly performed, but the reading was a failure. In this case, even when the OVS operation fails, detection information corresponding to the first detection case C1 may be transmitted to the controller 200 (see FIG. 1) at the seventh read level R7. Referring to FIG. 13B, an offset (−100 mV) corresponding to detection information (C1 of R7) may be updated in a history read level table (HRT) using an OVS table (OVST). Referring to FIG. 13C, a second detection case C2 may be determined for the seventh read level R7 in a next OVS operation using the updated HRT. Referring to FIG. 13D, an offset (−80 mV) corresponding to the second detection case C2 determined for the seventh read level R7 may be cumulatively updated in the HRT regardless of a success/failure of the next OVS operation. Therefore, the offset for the seventh read level R7 in the HRT may be finally −180 mV.

FIGS. 11 to 13D illustrate an example in which OVS recovery codes, interlocking with each other between the non-volatile memory device 100 and the controller 200, may be performed. However, an example embodiment thereof is not limited thereto. The OVS recovery code in the example embodiment may be performed as an on-chip operation in the non-volatile memory device. For example, the non-volatile memory device may perform a next OVS operation by changing a read level in a specific situation without checking a pass/failure of the first OVS operation.

Figure 14A:
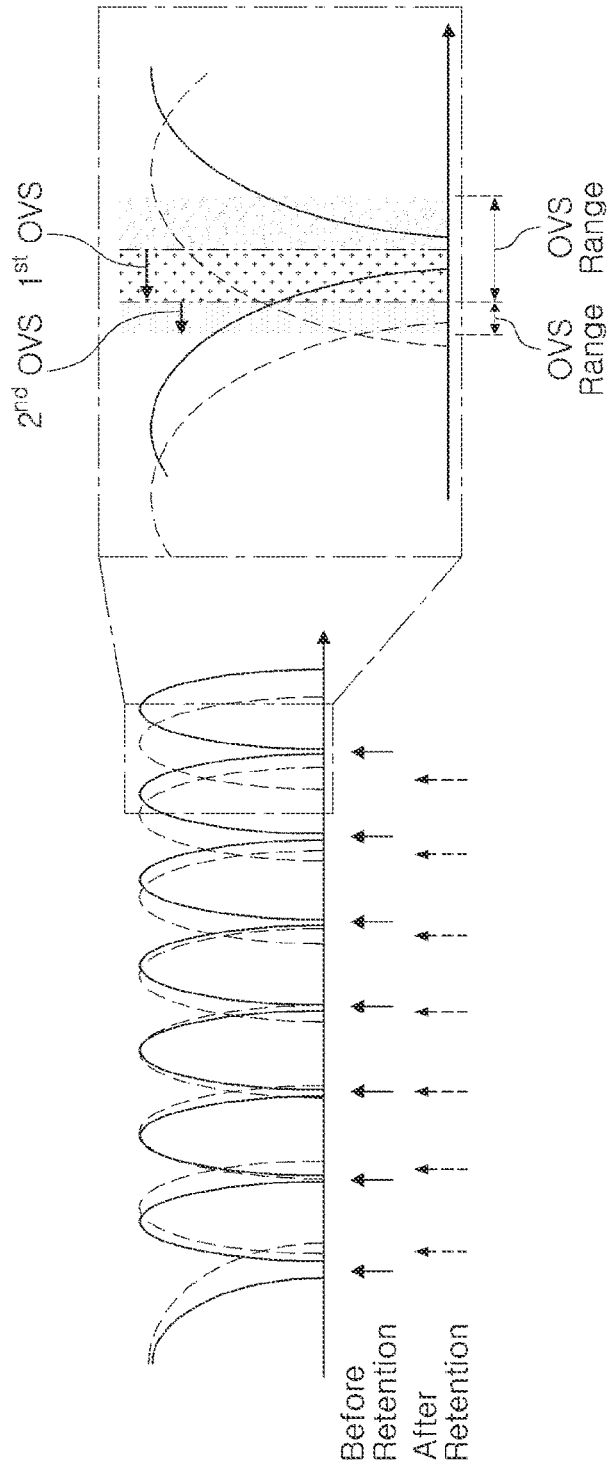
FIGS. 14A and 14B are diagrams illustrating an on-chip OVS operation performed by a non-volatile memory device according to an example embodiment of the present disclosure.
Figure 14B:
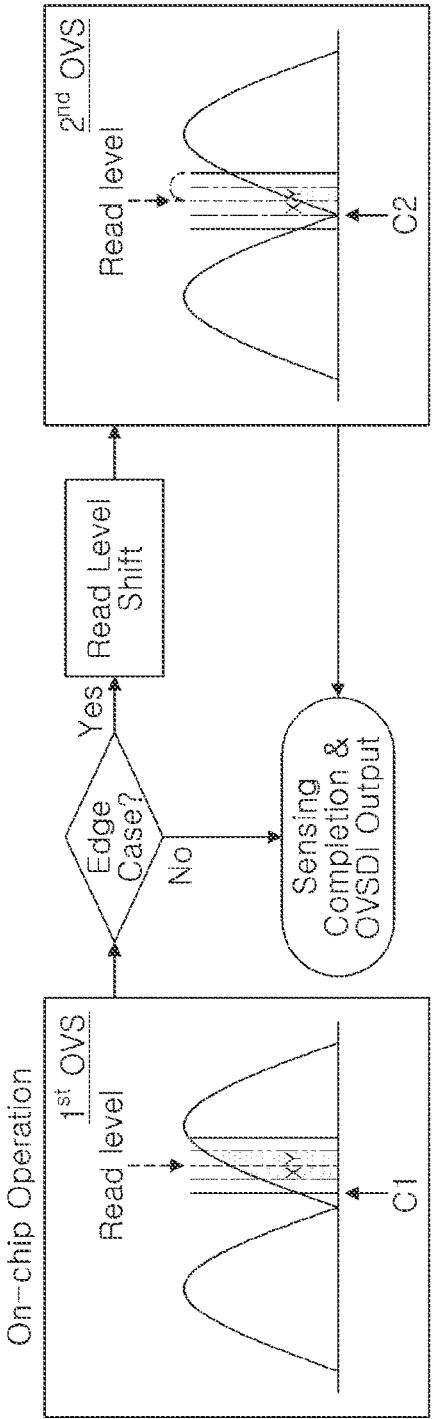

FIGS. 14A and 14B are diagrams illustrating an on-chip OVS operation performed by a non-volatile memory device according to an example embodiment.

As illustrated in FIG. 14A, the on-chip OVS operation may include a first OVS operation and a second OVS operation. Distribution may change before and after retention. As illustrated in FIG. 14B, when a detection case is determined as an edge case (e.g., C1 and C5 in FIG. 8A) in the first OVS operation, the second OVS operation may be performed by changing the read level. When the detection case is not an edge case, the sensing operation may be completed, and the detection information OVSDI may be output to the controller 200.

Figure 15A:
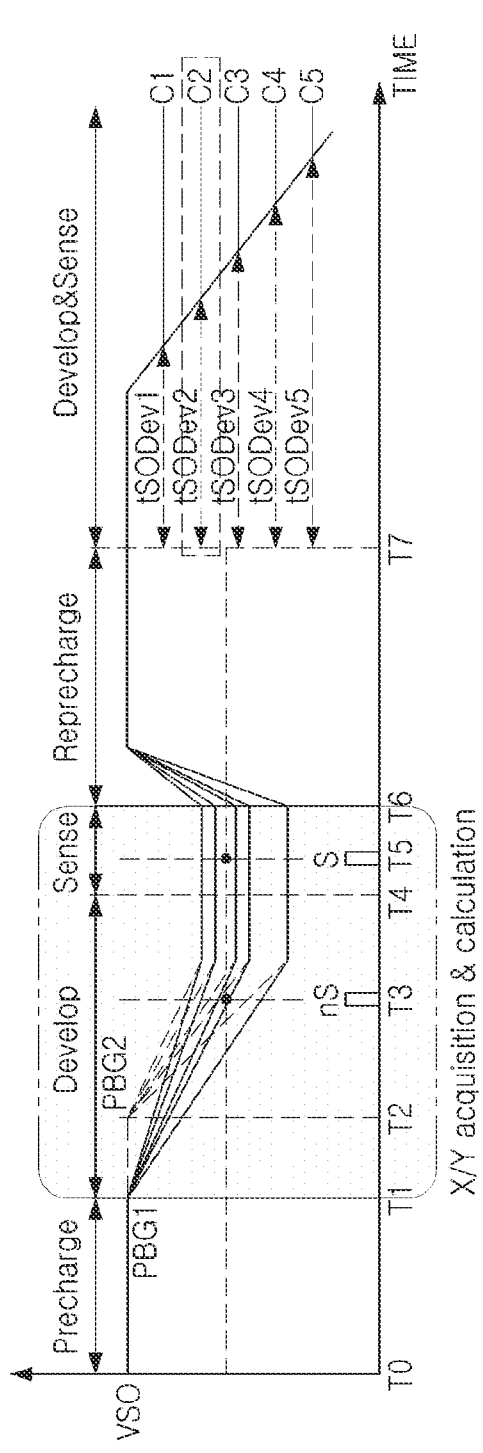
FIGS. 15A, 15B, and 15C are diagrams illustrating timing of an on-chip OVS operation performed by a non-volatile memory device according to an example embodiment of the present disclosure.
Figure 15B:
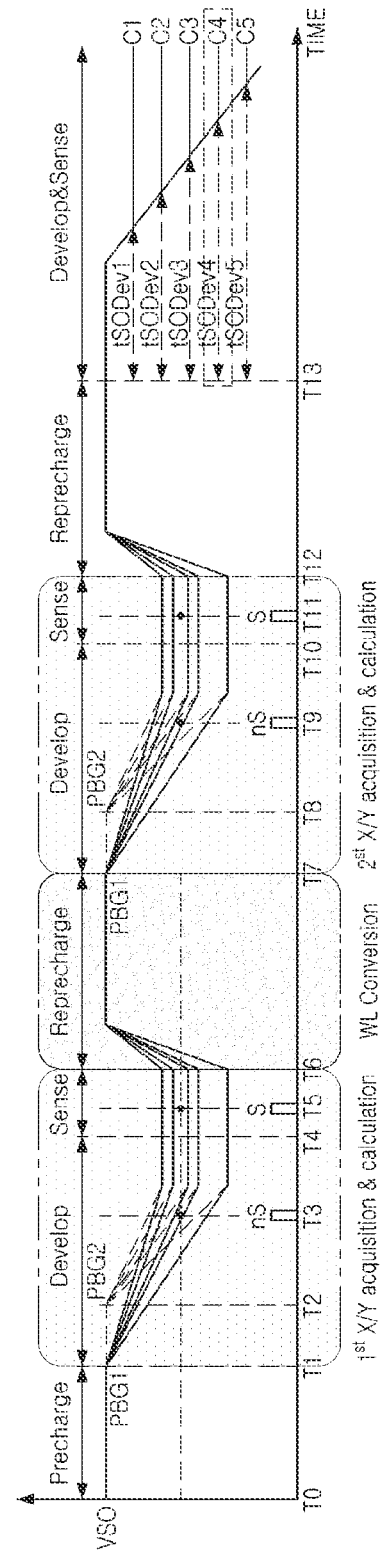
Figure 15C:
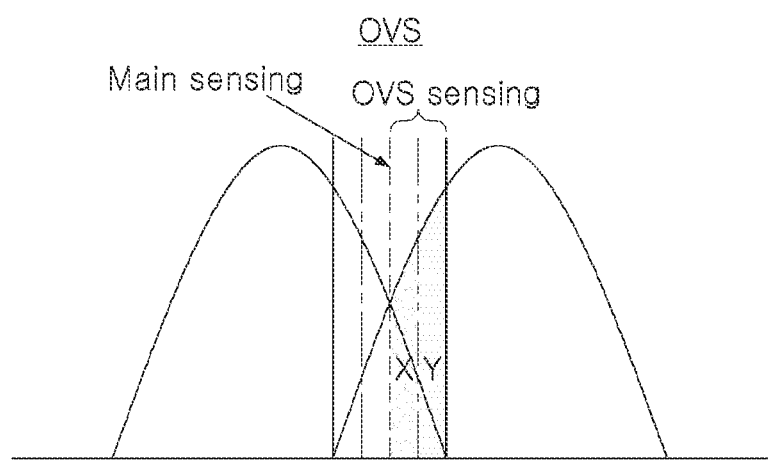

FIGS. 15A, 15B, and 15C are diagrams illustrating a timing of an on-chip OVS operation performed by a non-volatile memory device according to an example embodiment.

FIG. 15A is a diagram illustrating a timing of detection cases C2, C3, and C4 other than an edge case in an initial OVS operation. When the detection case (one of C2, C3, and C4) other than the edge case is determined as a result of obtaining cell count information (X/Y) and calculating the detection case, main sensing may be performed on a develop time tSODev2 corresponding to the detected case C2 as illustrated in FIG. 15A.

FIG. 15B is a diagram illustrating a timing of detection cases C1 and C5, edge cases, in the first OVS operation. As a result of obtaining the cell count information (1st X/Y) and calculating the detection cases in the first OVS operation, the edge cases C1 and C5 may be determined. In this case, a read level of the selected wordline may be changed by a predetermined offset. Thereafter, a second OVS operation may be performed. As a result of acquiring the cell count information (2nd X/Y) and calculating the detection cases in the second OVS operation, when a detection case (one of C2, C3, and C4) other than an edge case is determined, main sensing may be performed on develop time tSODev4 corresponding to the detected case C4 as illustrated in FIG. 15B.

As illustrated in FIG. 15C, the on-chip OVS operation may search for a distribution valley for the OVS operation, and main sensing may be performed according to the searched distribution valley.

Figure 16:
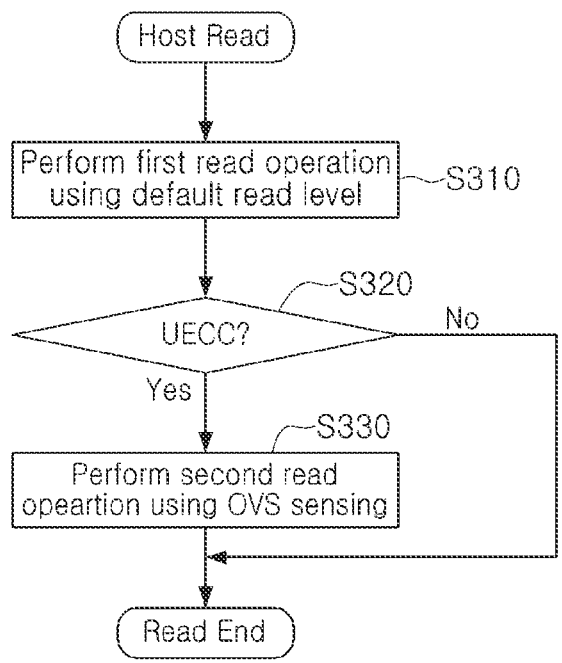
FIG. 16 is a flowchart illustrating a reading method of a storage device according to another example embodiment of the present disclosure.

FIG. 16 is a flowchart illustrating a reading method of a storage device 10 according to another example embodiment. Referring to FIGS. 1 to 16, a read operation of the storage device 10 may be performed as follows.

The non-volatile memory device 100 (see FIG. 1) may perform a first read operation using the default read level in response to a first command transmitted from the controller 200 (see FIG. 1) (S310). Information corresponding to the default read level may be transmitted from the controller 200 along with the first command. The default read level information may include offset information of a history read level table (HRT).

The controller 200 may determine whether a UECC occurs as a result of the first read operation (S320). When the UECC has not occurred, the read operation may be completed.

When the UECC has occurred, the non-volatile memory device 100 may perform a second read operation using OVS sensing in response to the second command transmitted from the controller 200 (S330). The OVS sensing may accumulate offset information corresponding to detection information OVSDI in the HRT regardless of a failure of the initial OVS operation as illustrated in FIGS. 1 to 15C. Accordingly, the read operation may be completed.

Figure 17:
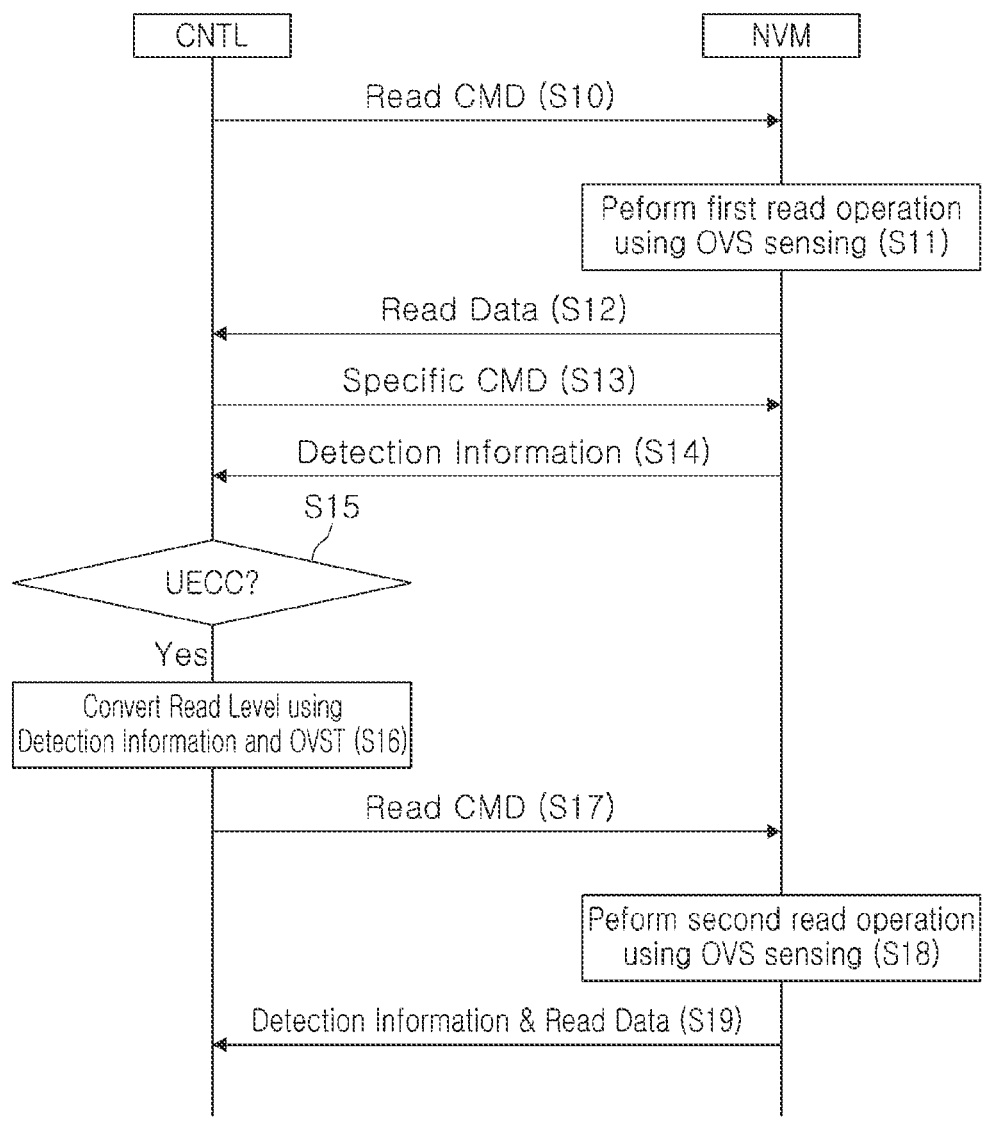
FIG. 17 is a ladder diagram illustrating a process of OVS recovery code of a storage device according to an example embodiment of the present disclosure.

FIG. 17 is a ladder diagram illustrating a process of an OVS recovery code of a storage device 10 according to an example embodiment. Referring to FIGS. 1 to 17, the OVS recovery code process of the storage device 10 may be performed as follows.

The controller CNTL may, upon entering the OVS recovery code, transmit a read command to the non-volatile memory device NVM (S10). The non-volatile memory device NVM may perform a first read operation using the OVS sensing in response to the read command (S11). Data read in the first read operation may be transmitted to the controller CNTL (S12). Thereafter, the controller CNTL may transmit a specific command to the non-volatile memory device NVM (S13), and the non-volatile memory device NVM may output detection information OVSDI corresponding to a detection case of the OVS sensing to the controller CNTL in response to the specific command (S14).

Thereafter, the controller CNTL may determine whether the read data is error-correctable using an error correction circuit ECC (S15). When the data read in the first read operation is uncorrectable (UECC), the controller CNTL may change the read level using the detection information OVSDI and the OVST (S16).

Thereafter, the controller CNTL may transmit again the read command to the non-volatile memory device NVM (S17) along with the changed read level information. The non-volatile memory device NVM may perform a second read operation using the OVS sensing based on the changed read level in response to a read command (S18). Thereafter, data and detection information read in the second read operation may be transmitted to the controller CNTL (S19).

The OVS recovery code in the example embodiment may update the HRT every time the OVS sensing is performed.

Figure 18:
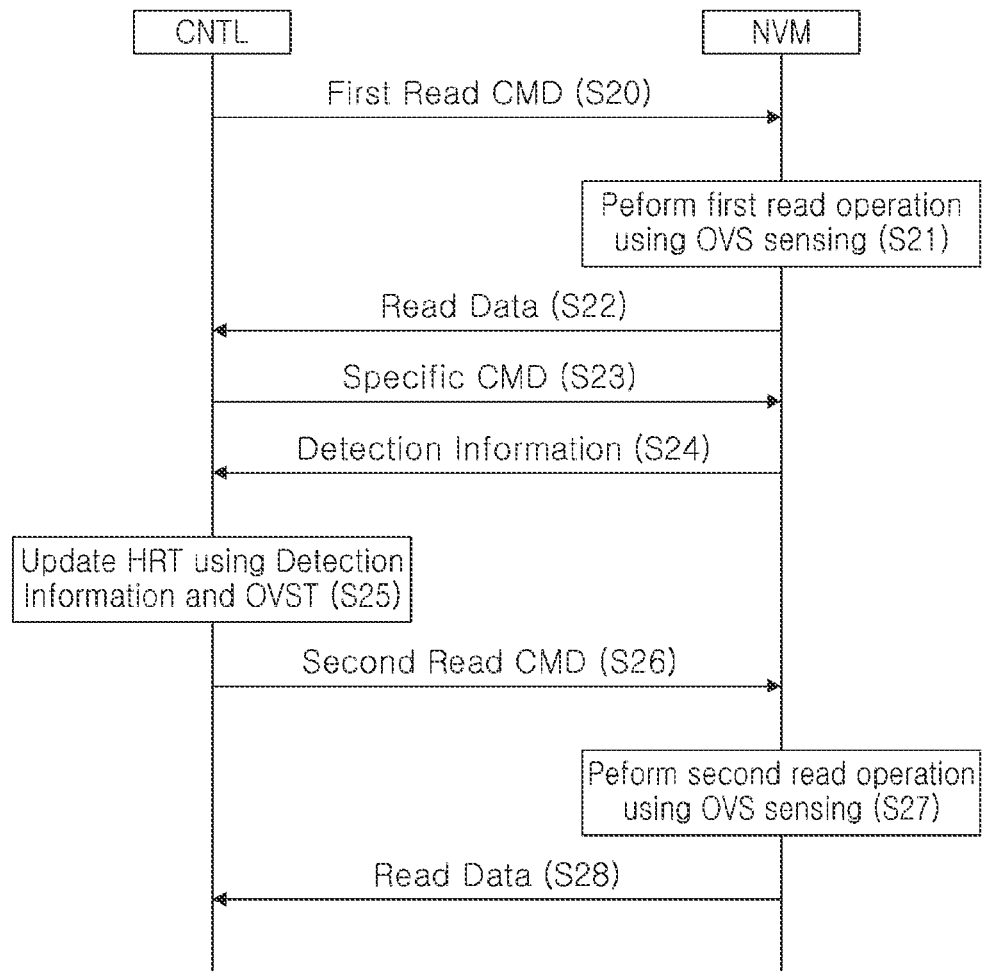
FIG. 18 is a ladder diagram illustrating a process of OVS recovery code of a storage device according to another example embodiment of the present disclosure.

FIG. 18 is a ladder diagram illustrating a process of an OVS recovery code of a storage device 10 according to another example embodiment. Referring to FIGS. 1 to 16 and 18, the OVS recovery code process of the storage device 10 may proceed as follows.

The controller CNTL may, upon entering the OVS recovery code, transmit a first read command to a non-volatile memory device NVM (S20). The non-volatile memory device NVM may perform a first read operation using OVS sensing in response to the first read command (S21). The data read in the first read operation may be transmitted to the controller CNTL (S22), the controller CNTL may transmit a specific command to the non-volatile memory device NVM (S23), and the non-volatile memory device NVM may output detection information OVSDI corresponding to the OVS sensing in response to the specific command (S24). The controller CNTL may update the history read level table (HRT) using the detection information OVSDI according to the OVS sensing and the OVST (S25). The HRT may accumulate a read level offset according to the OVS sensing regardless of whether the first read operation succeeds or fails.

Thereafter, the controller CNTL may transmit the second read command to the non-volatile memory device NVM along with the changed read level information (S26). The non-volatile memory device NVM may perform a second read operation using the OVS sensing with reference to the changed read level in response to a second read command (S27). Thereafter, data and detection information read in the second read operation may be transmitted to the controller CNTL (S28).

The OVS recovery code in the example embodiment may perform a plurality of OVS sensing operations while changing the read level in response to a single read command.

Figure 19:
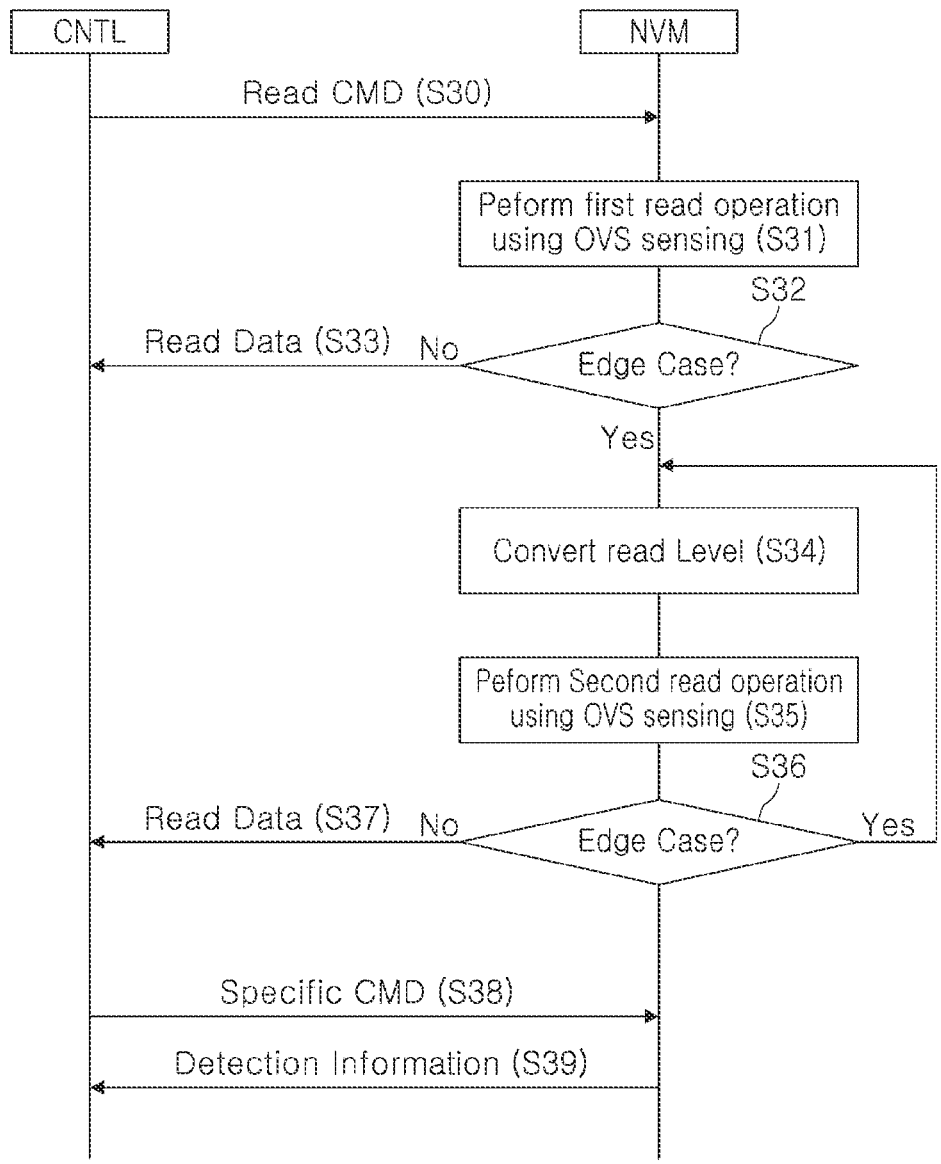
FIG. 19 is a ladder diagram illustrating a process of OVS recovery code of a storage device according to another example embodiment of the present disclosure.

FIG. 19 is a ladder diagram illustrating a process of an OVS recovery code of a storage device 10 according to another example embodiment. Referring to FIGS. 1 to 16 and 19, the OVS recovery code process of the storage device 10 may proceed as follows.

The controller CNTL may, upon entering the OVS recovery code, transmit a read command to the non-volatile memory device NVM (S30), and the non-volatile memory device NVM may perform a first read operation using OVS sensing in response to a read command (S31).

In the first read operation, it may be determined whether the detection case is an edge case (S32). When the detection case is not an edge case, the read data in the first read operation may be output to the controller CNTL (S33). When the detection case is an edge case, the read level may be changed (S34). Thereafter, a second read operation using the OVS sensing may be performed using the changed read level (S35). Thereafter, in the second read operation, it may be determined whether the detection case is an edge case (S36). When the detection case is not an edge case, the read data in the second read operation may be output to the controller CNTL (S37). When the detection case is an edge case, the device may enter operation S34 of changing the read level.

Thereafter, the controller CNTL may transmit a specific command to the non-volatile memory device NVM (S38), and the non-volatile memory device NVM may output the detection information OVSDI corresponding to the detection case of the first or second read operation in response to a specific command (S39).

Figure 20:
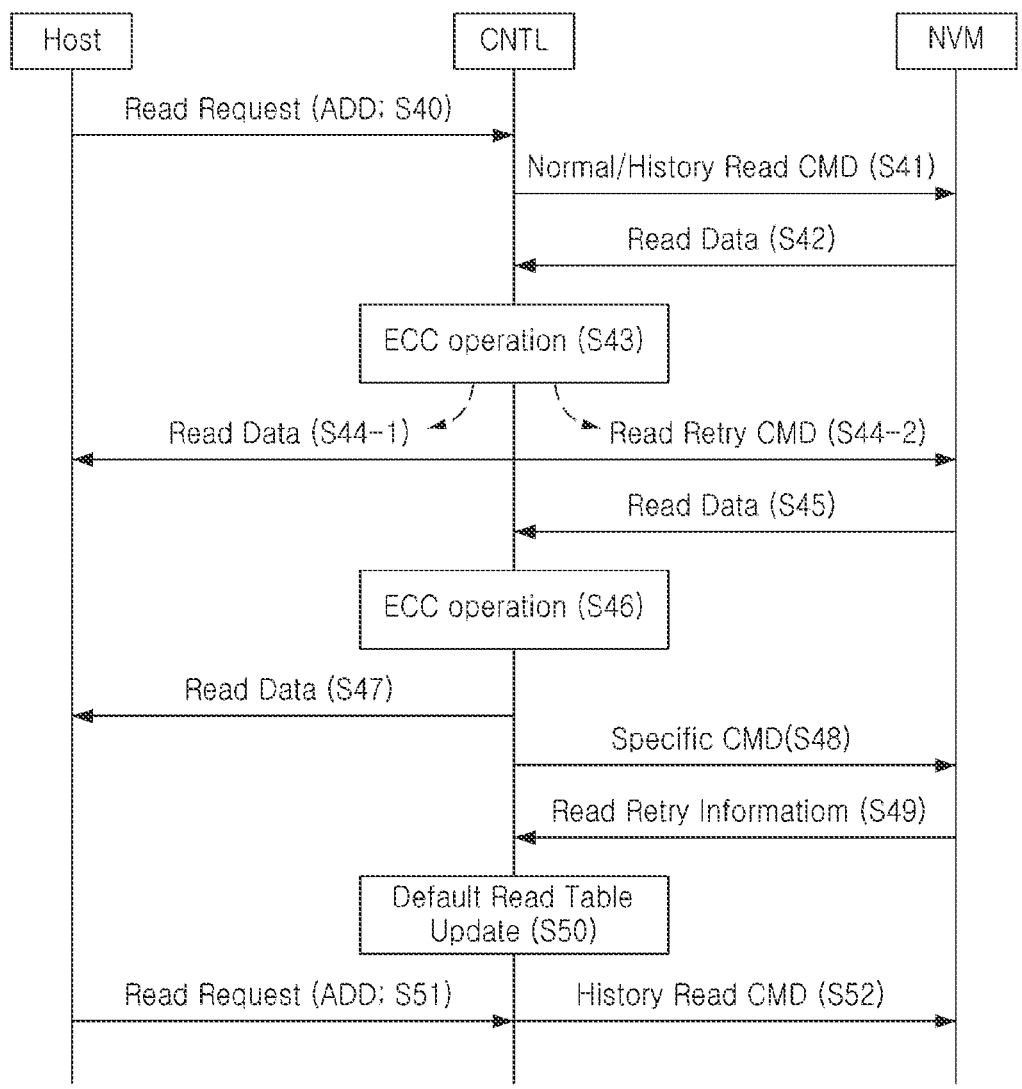
FIG. 20 is a ladder diagram illustrating a read operation of a storage device according to another example embodiment of the present disclosure.

FIG. 20 is a ladder diagram illustrating a read operation of a storage device according to another example embodiment. Referring to FIGS. 1 to 20, a read operation of the storage device may be performed as follows.

A host may transmit a read request to the storage device 10 along with an address ADD (see FIG. 1) (S40). The controller 200 of the storage device 10 may receive the read request, may determine whether to perform a history read operation or a normal read operation by searching for a history buffer, and may transmit a normal/history read command corresponding to the determined operation to the non-volatile memory device NVM (100) (see FIG. 1) (S41). The non-volatile memory device 100 may perform a read operation in response to a normal/history read command and may transmit data read accordingly to the controller 200 (S42).

Thereafter, the controller 200 may perform an error correction operation on the data read by the error correction circuit 230 (S43). When no error is present or the error is correctable, read data or corrected data may be transmitted to the host (S44-1).

When the error correction is not possible, the controller 200 may transmit a read retry command to the non-volatile memory device 100 (S44-2). The non-volatile memory device 100 may perform a read operation using OVS sensing in response to the read retry command and may transmit the read data to the controller 200 (S45). In the read operation using the OVS sensing, even when the OVS operation fails, the read level offset may be reflected in the HRT using the OVST as illustrated in FIGS. 1 to 19.

Thereafter, the controller 200 may perform an error correction operation on the data read from the error correction circuit 230 again (S46). If no error is present or the error is correctable, read data or corrected data may be transmitted to the host (S47). Thereafter, the controller 200 may transmit a specific command to the non-volatile memory device 100 to obtain read retry information having the read level information (S48). The non-volatile memory device 100 may output read retry information in response to the specific command (S49). Thereafter, the controller 200 may finally update the history read level table HRT using the read retry information (S50).

Thereafter, when a read request for the same address ADD is received from the host (SM), the storage device 100 may transmit a history read command using the optimal read level reflected in the history read level table HRT to the non-volatile memory device 100 (S52).

The storage device in the example embodiment may include an artificial intelligence processor dedicated to the recovery code.

Figure 21:
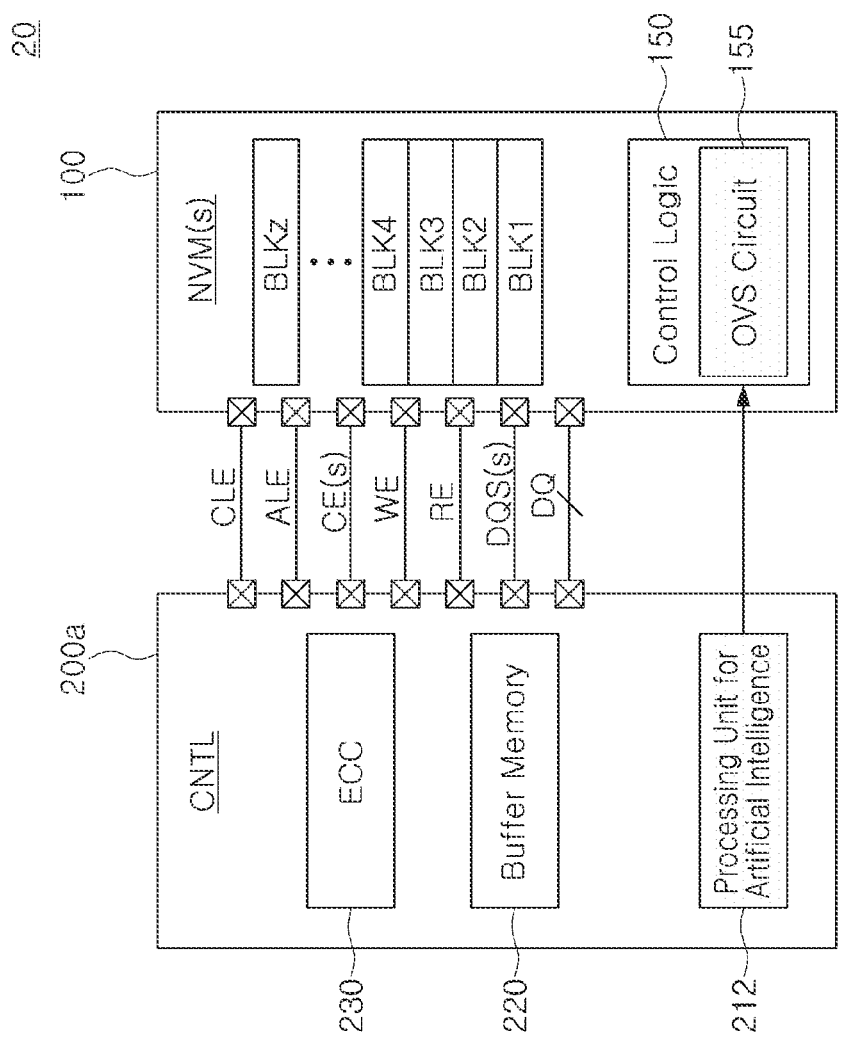
FIG. 21 is a diagram illustrating a storage device according to another example embodiment of the present disclosure.

FIG. 21 is a diagram illustrating a storage device 20 according to another example embodiment. Referring to FIG. 21, the storage device 20 may include an artificial intelligence processor 212 configured to control an OVS recovery code, differently from the example illustrated in FIG. 1. The artificial intelligence processor 212 may perform machine learning to manage reliability of the non-volatile memory device 100.

Figure 22:
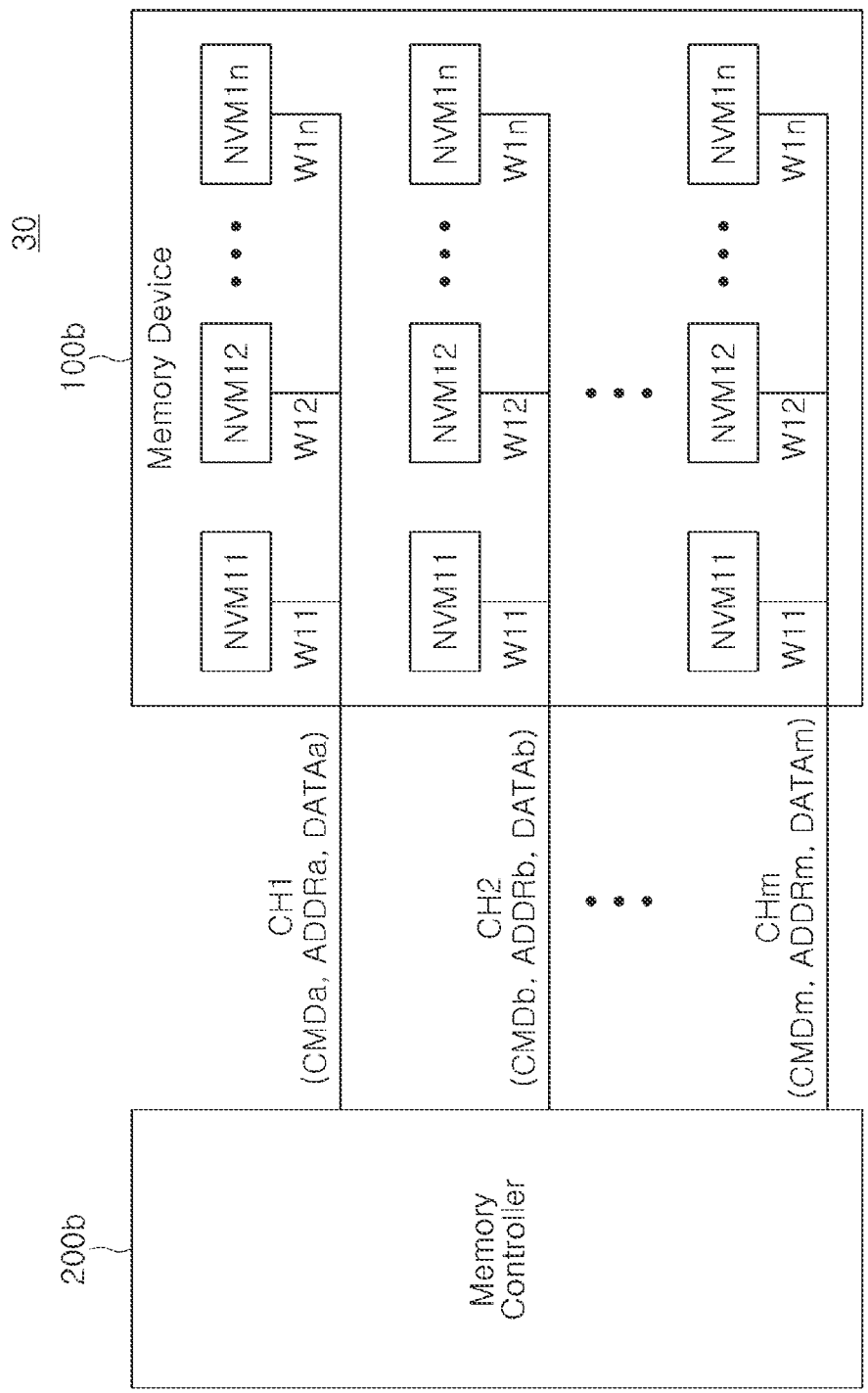
FIG. 22 is a block diagram illustrating a memory system according to another example embodiment of the present disclosure.

FIG. 22 is a block diagram illustrating a memory system according to another example embodiment. Referring to FIG. 22, the memory system 30 may include a memory device 100*b* and a memory controller 200*b*. The memory system 30 may support a plurality of channels CH1 to CHm, and the memory device 100*b* may be connected to the memory controller 200*b* through the plurality of channels CH1 to CHm. For example, the memory system 30 may be implemented by a storage device such as a solid state drive (SSD). The memory system 30 may be implemented to perform the OVS recovery code as illustrated in FIGS. 1 to 21.

The memory device 100*b* may include a plurality of non-volatile memory devices NVM11 to NVMmn Each of the non-volatile memory devices NVM11 to NVMmn may be connected to one of the plurality of channels CH1 to CHm through a corresponding way. For example, the non-volatile memory devices NVM11 to NVM1n may be connected to the first channel CH1 through the ways W11 to W1n, the non-volatile memory devices NVM21 to NVM2n may be connected to the second channel CH2 through the ways W21 to W2n, and the non-volatile memory devices NVMm1 to NVMmn may be connected to the mth channel CHm through the ways Wm1 to Wmn. In an example embodiment, each of the non-volatile memory devices NVM11 to NVMmn may be implemented by an arbitrary memory unit which may operate according to an individual command from the memory controller 200*b*. For example, each of the non-volatile memory devices NVM11 to NVMmn may be implemented as a chip or a die, but an example embodiment thereof is not limited thereto.

The memory controller 200*b* may transmit signals to and receive signals from the memory device 100*b* through a plurality of channels CH1 to CHm. For example, the memory controller 200*b* may transmit commands CMDa to CMDm, addresses ADDRa to ADDRm, and DATAa to DATAm to the memory device 100 or may receive the DATAa to DATAm from the memory device 100 through channels CH1 to CHm.

The memory controller 200*b* may select one of non-volatile memory devices connected to a corresponding channel through each channel, and may transmit signals to and receive signals from the selected non-volatile memory device. For example, the memory controller 200*b* may select the non-volatile memory device NVM11 from among the non-volatile memory devices NVM11 to NVM1n connected to the first channel CH1. The memory controller 200*b* may transmit the command CMDa, the address ADDRa, and the DATAa to the selected non-volatile memory device NVM11 or may receive the DATAa from the selected non-volatile memory device NVM11 through the first channel CH1.

The memory controller 200*b* may transmit signals to and receive signals from the memory device 100*b* in parallel through different channels. For example, while the memory controller 200*b* transmits the command CMDa to the memory device 100*b* through the first channel CH1, the memory controller 200*b* may transmit the command CMDb to the memory device 100*b* through the second channel CH2. For example, the memory controller 200*b* may receive the DATAb from the memory device 100*b* through the second channel CH2 while receiving the DATAa from the memory device 100*b* through the first channel CH1.

The memory controller 200*b* may control overall operation of the memory device 100*b*. The memory controller 200*b* may control each of the non-volatile memory devices NVM11 to NVMmn connected to the channels CH1 to CHm by transmitting signals to the channels CH1 to CHm. For example, the memory controller 200*b* may control one of the non-volatile memory devices NVM11 to NVM1n by transmitting the command CMDa and the address ADDRa to the first channel CH1.

Each of the non-volatile memory devices NVM11 to NVMmn may operate under control of the memory controller 200*b*. For example, the non-volatile memory device NVM11 may program the DATAa according to the command CMDa, the address ADDRa, and the DATAa provided to the first channel CH1. For example, the non-volatile memory device NVM21 may read the DATAb according to the command CMDb and the address ADDRb provided to the second channel CH2 and may transmit the read DATAb to the memory controller 200b.

FIG. 22 illustrates the example in which the memory device 100b communicates with the memory controller 200b through m number of channels, and the memory device 100b may include n number of non-volatile memory devices corresponding to each channel. The number of channels and the number of non-volatile memory devices connected to a single channel may be varied.

The non-volatile memory device in the example embodiment may be implemented in a chip to chip (C2C) structure.

Figure 23:
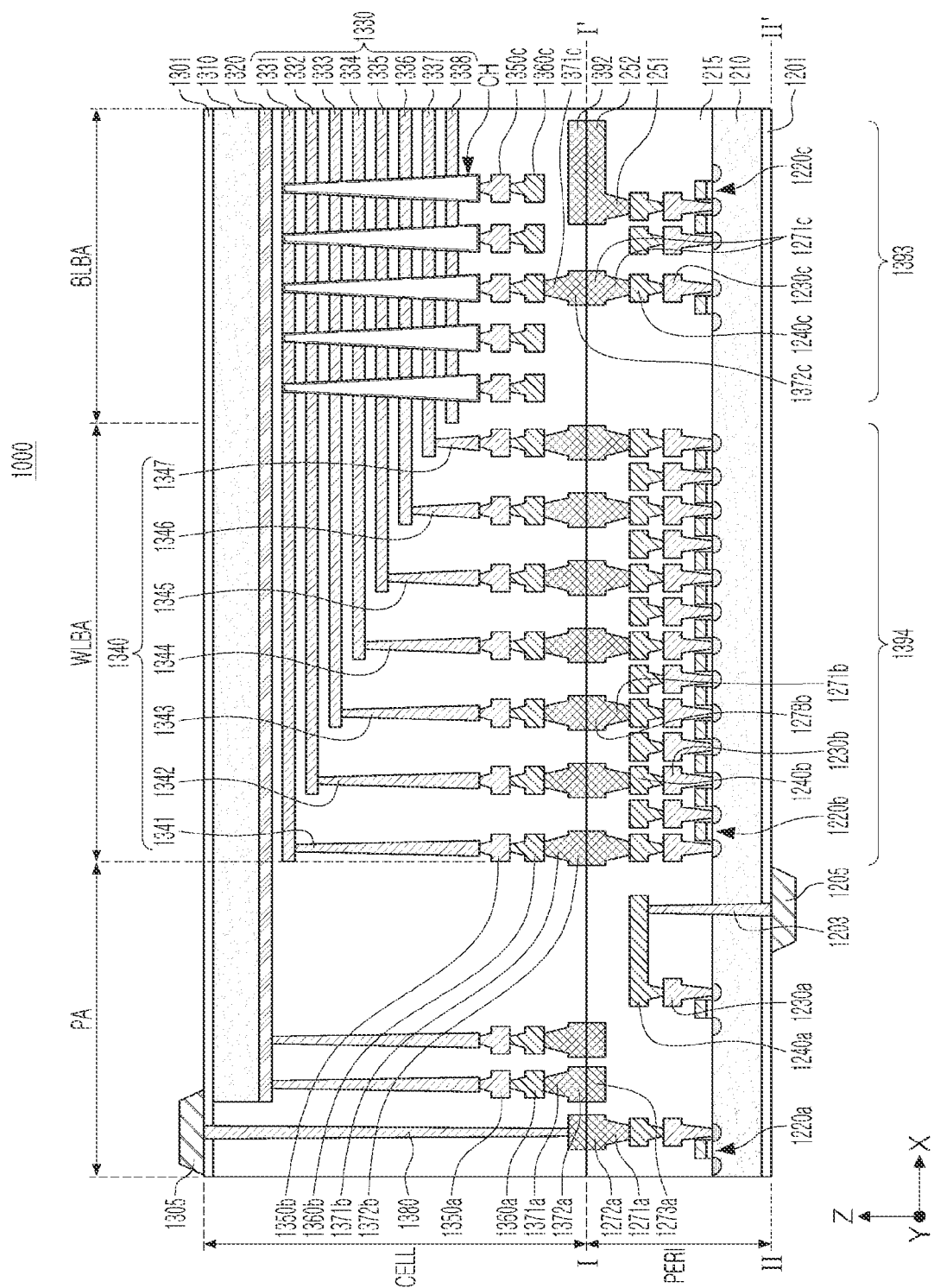
FIG. 23 is a diagram illustrating a non-volatile memory device implemented in a C2C structure according to an example embodiment of the present disclosure.

FIG. 23 is a diagram illustrating a non-volatile memory device 1000 implemented in a C2C structure according to an example embodiment. In the C2C structure, an upper chip including a cell region CELL may be manufactured on a first wafer, a lower chip including a peripheral circuit region PERI may be manufactured on a second wafer different from the first wafer, and the upper chip and the lower chip may be connected to each other by a bonding method. For example, the bonding method may be a method of electrically connecting a bonding metal formed on a lowermost metal layer of an upper chip to a bonding metal formed on an uppermost metal layer of a lower chip. In the example embodiment, when the bonding metal is formed of copper (Cu), the bonding method may be a Cu-to-Cu bonding method. In another example embodiment, the bonding metal may be formed of aluminum (Al) or tungsten (W).

Each of the peripheral circuit region PERI and the cell region CELL of the non-volatile memory device 1000 may include an external pad bonding region PA, a wordline bonding region WLBA, and a bitline bonding region BLBA.

The peripheral circuit region PERI may include a first substrate 1210, an interlayer insulating layer 1215, a plurality of circuit devices 1220a, 1220b, and 1220c formed on the first substrate 1210, first metal layers 1230a, 1230b, and 1230c connected to the plurality of circuit devices 1220a, 1220b, and 1220c, respectively, and second metal layers 1240a, 1240b, and 1240c formed on the first metal layers 1230a, 1230b, and 1230c, respectively. In the example embodiment, the first metal layers 1230a, 1230b, and 1230c may be formed of tungsten having a relatively high resistivity. In the example embodiment, the second metal layers 1240a, 1240b, and 1240c may be formed of copper having a relatively low resistivity.

FIG. 23 illustrates the first metal layers 1230a, 1230b, and 1230c and the second metal layers 1240a, 1240b, and 1240c, but an example embodiment thereof is not limited thereto. At least one metal layer may be further formed on the second metal layers 1240a, 1240b, and 1240c. At least a portion of the one or more metal layers formed on the second metal layers 1240a, 1240b, and 1240c may be formed of aluminum having resistivity different from that of copper forming the second metal layers 1240a, 1240b, and 1240c.

In the example embodiment, an interlayer insulating layer 1215 may be disposed on the first substrate 1210 to cover the plurality of circuit devices 1220a, 1220b, and 1220c, the first metal layers 1230a, 1230b, and 1230c, and the second metal layers 1240a, 1240b, and 1240c. In the example embodiment, the interlayer insulating layer 1215 may include an insulating material such as silicon oxide or silicon nitride.

Lower bonding metals 1271b and 1278b may be formed on the second metal layer 1240b of the wordline bonding region WLBA. In the wordline bonding region WLBA, the lower bonding metals 1271b and 1278b of the peripheral circuit region PERI may be electrically connected to the upper bonding metals 1371b and 1372b of the cell region CELL by a bonding method. In the example embodiment, the lower bonding metals 1271b and 1278b and the upper bonding metals 1371b and 1372b may be formed of aluminum, copper, or tungsten. Also, the upper bonding metals 1371b and 1372b of the cell region CELL may be referred to as first metal pads, and the lower bonding metals 1271b and 1278b may be referred to as second metal pads.

The cell region CELL may include at least one memory block. In the example embodiment, the cell region CELL may include the second substrate 1310 and the common source line 1320. On the second substrate 1310, a plurality of wordlines 1331 to 1338 (1330) may be stacked in a direction (Z-axis direction) perpendicular to an upper surface of the second substrate 1310. In the example embodiment, string select lines and ground select lines may be disposed on upper and lower portions of the wordlines 1330. In the example embodiment, a plurality of wordlines 1330 may be disposed between the string select lines and the ground select line.

In the bitline bonding region BLBA, the channel structure CH may extend in a direction (Z-axis direction) perpendicular to the upper surface of the second substrate 1310 and may penetrate wordlines 1330, string select lines, and ground select lines. The channel structure CH may include a data storage layer, a channel layer, and a buried insulating layer, and the channel layer may be electrically connected to the first metal layer 1350c and the second metal layer 1360c. For example, the first metal layer 1350c may be configured as a bitline contact, and the second metal layer 1360c may be configured as a bitline. In the example embodiment, the bitline 1360c may extend in a first direction (Y-axis direction) parallel to the upper surface of the second substrate 1310.

As illustrated in FIG. 23, a region in which the channel structure CH and the bitline 1360c are disposed may be defined as a bitline bonding region BLBA. In the example embodiment, the bitline 1360c may be electrically connected to the circuit devices 1220c providing the page buffer 1393 in the peripheral circuit region PERI in the bitline bonding region BLBA. For example, the bitline 1360c may be connected to the upper bonding metals 1371c and 1372c in the peripheral circuit region PERI. The upper bonding metals 1371c and 1372c may be connected to the lower bonding metals 1271c and 1272c connected to the circuit devices 1220c of the page buffer 1393. In the wordline bonding region WLBA, the wordlines 1330 may extend in a second direction (X-axis direction) perpendicular to the first direction and parallel to the upper surface of the second substrate 1310. In the example embodiment, the wordline bonding region WLBA may be connected to the plurality of cell contact plugs 1341 to 1347 (1340). For example, the wordlines 1330 and the cell contact plugs 1340 may be connected to each other in pads provided by extending at least a portion of the wordlines 1330 in the second direction by different lengths. In the example embodiment, the first metal layer 1350b and the second metal layer 1360b may be connected in order on an upper portion of the cell contact plugs 1340 connected to the wordlines 1330. In the example embodiment, the cell contact plugs 1340 may be connected to the peripheral circuit region PERI through the upper bonding metals 1371b and 1372b of the cell region CELL and the lower bonding metals 1271b and 1278b of the peripheral circuit region PERI in the wordline bonding region WLBA.

In the example embodiment, the cell contact plugs 1340 may be electrically connected to the circuit devices 1220b providing the row decoder 1394 in the peripheral circuit region PERI. In the example embodiment, operating voltages of the circuit devices 1220b providing the row decoder 1394 may be different from the operating voltages of the circuit devices 1220c providing the page buffer 1393. For example, the operating voltage of the circuit devices 1220c providing the page buffer 1393 may be greater than the operating voltage of the circuit devices 1220b providing the row decoder 1394.

A common source line contact plug 1380 may be disposed in the external pad bonding region PA. In the example embodiment, the common source line contact plug 1380 may be formed of a conductive material such as a metal, a metal compound, or polysilicon. The common source line contact plug 1380 may be electrically connected to the common source line 1320. A first metal layer 1350a and a second metal layer 1360a may be stacked in order on the common source line contact plug 1380. For example, a region in which the common source line contact plug 1380, the first metal layer 1350a, and the second metal layer 1360a are disposed may be defined as an external pad bonding region PA. The second metal layer 1360a may be electrically connected to the upper metal via 1371a. The upper metal via 1371a may be electrically connected to the upper metal pattern 1372a.

Input and output pads 1205 and 1305 may be disposed in the external pad bonding region PA. Referring to FIG. 23, a lower insulating layer 1201 covering a lower surface of the first substrate 1210 may be formed on a lower portion of the first substrate 1210. Also, a first input and output pad 1205 may be formed on the lower insulating layer 1201. In the example embodiment, the first input and output pad 1205 may be connected to at least one of the plurality of circuit devices 1220a, 1220b, and 1220c disposed in the peripheral circuit region PERI through the first input and output contact plug 1203. In the example embodiment, the first input and output pad 1205 may be isolated from the first substrate 1210 by the lower insulating layer 1201. Also, since a side-surface insulating layer is disposed between the first input and output contact plug 1203 and the first substrate 1210, the first input and output contact plug 1203 and the first substrate 1210 may be electrically isolated.

Referring to FIG. 23, an upper insulating layer 1301 covering an upper surface of the second substrate 1310 may be formed on the second substrate 1310. Also, a second input and output pad 1305 may be disposed on the upper insulating layer 1301. In the example embodiment, the second input and output pad 1305 may be connected to at least one of the plurality of circuit devices 1220a, 1220b, and 1220c disposed in the peripheral circuit region PERI through the second input and output contact plug 1303, the lower metal pattern 1272a, and the lower metal via 1271a.

In the example embodiment, the second substrate 1310 and the common source line 1320 may not be disposed in a region in which the second input and output contact plug 1303 is disposed. Also, the second input and output pad 1305 may not overlap the wordlines 1330 in the third direction (Z-axis direction). Referring to FIG. 23, the second input and output contact plug 1303 may be isolated from the second substrate 1310 in a direction parallel to the upper surface of the second substrate 1310. Also, the second input and output contact plug 1303 may penetrate the interlayer insulating layer 1215 of the cell region CELL and may be connected to the second input and output pad 1305. In the example embodiment, the second input and output pad 1305 may be electrically connected to the circuit device 1220a.

In the example embodiment, the first input and output pad 1205 and the second input and output pad 1305 may be selectively formed. For example, the non-volatile memory device 1000 may include only a first input and output pad 1205 disposed on an upper portion of the first substrate 1201 or a second input and output pad 1305 disposed on an upper portion of the second substrate 1301. In another example embodiment, the non-volatile memory device 1000 may include both the first input and output pad 1205 and the second input and output pad 1305.

A metal pattern of the uppermost metal layer may be present as a dummy pattern in each of the outer pad bonding region PA and the bitline bonding region BLBA included in each of the cell region CELL and the peripheral circuit region PERI, or the uppermost metal layer may be configured to be empty.

In the non-volatile memory device 1000 in the example embodiment, in the external pad bonding region PA, a lower metal pattern 1273a having the same shape as that of the upper metal pattern 1372a of the cell region CELL may be formed on an uppermost metal layer of the region PERI to correspond to the upper metal pattern 1372a formed on the uppermost metal layer of the cell region CELL. The lower metal pattern 1273a formed on the uppermost metal layer of the peripheral circuit region PERI may not be connected to a contact in the peripheral circuit region PERI. Similarly, in the external pad bonding region PA, an upper metal pattern having the same shape as that of the lower metal pattern of the peripheral circuit region PERI may be formed on the upper metal layer of the cell region CELL to correspond to the lower metal pattern formed on the uppermost metal layer of the peripheral circuit region PERI.

Figure 24:
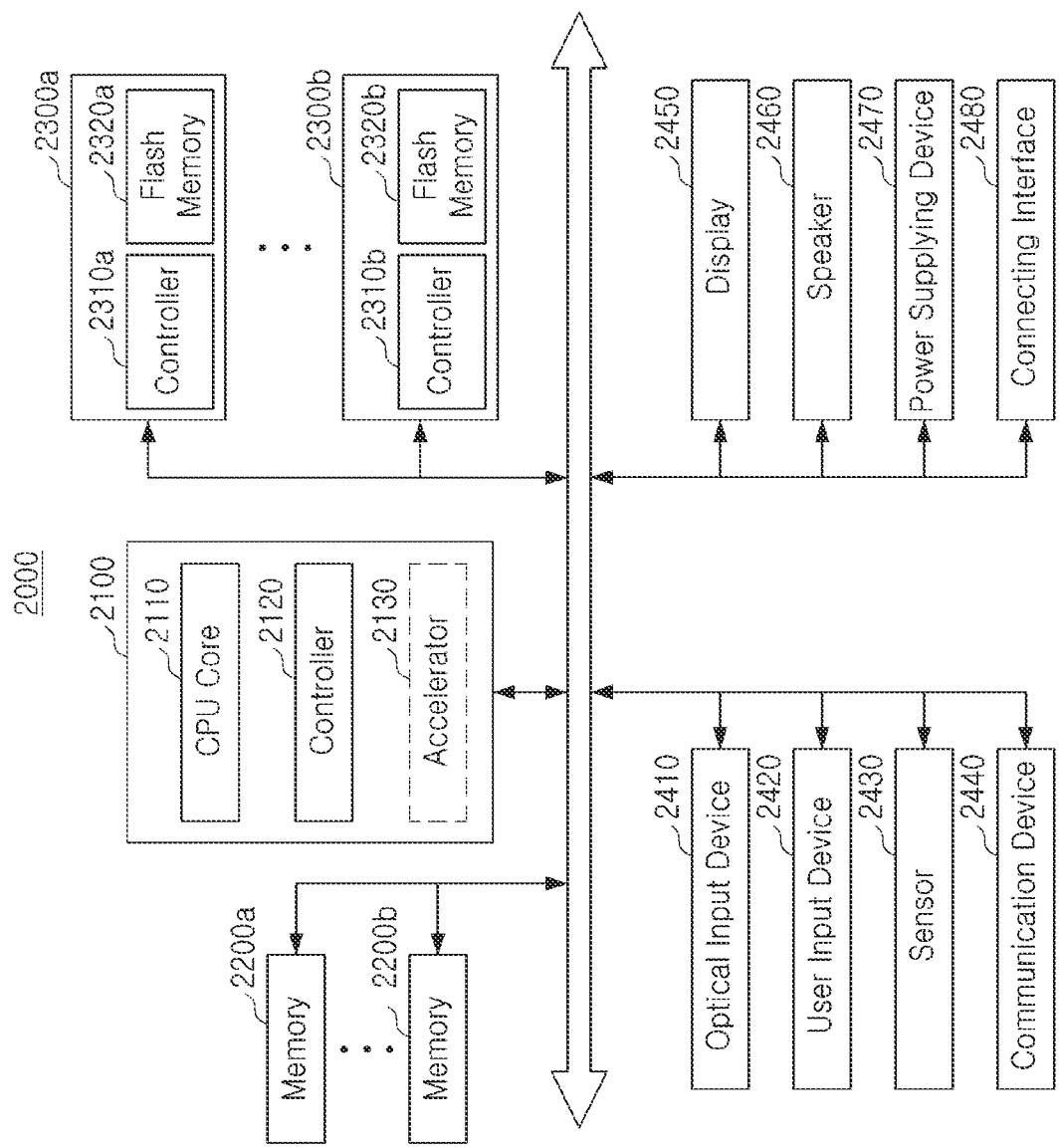
FIG. 24 is a diagram illustrating an electronic device in which a storage device is applied according to an example embodiment of the present disclosure.

FIG. 24 is a diagram illustrating an electronic device in which a storage device is applied according to an example embodiment. The electronic device 2000 in FIG. 24 may be implemented by a mobile system such as a portable communications terminal (mobile phone), a smart phone, a tablet personal computer (PC), a wearable device, a healthcare device, or an Internet of things (IoT) device. However, the electronic device 2000 in FIG. 24 is not necessarily limited to a mobile system and may be implemented by a personal computer, a laptop computer, a server, a media player, or an automotive device such as a navigation system.

Referring to FIG. 24, the electronic device 2000 may include a main processor 2100, memories 2200a and 2200b, and storage devices 2300a and 2300b, and may further include one or more of an image capturing device 2410, a user input device 2420, a sensor 2430, a communication device 2440, a display 2450, a speaker 2460, a power supply device 2470, and a connection interface 2480.

The main processor 2100 may control overall operation of the electronic device 2000 and operations of other components included in the system 2000, for example. The main processor 2100 may be implemented as a universal processor, a dedicated processor, or an application processor.

The main processor 2100 may include one or more CPU cores 2110, and may further include a controller 2120 for controlling the memories 2200a and 2200b and/or storage devices 2300a and 2300b. In example embodiments, the main processor 2100 may further include an accelerator block 2130, which is a dedicated circuit for high-speed data operation, such as an artificial intelligence (AI) data operation. The accelerator block 2130 may include a graphics processing unit (GPU), a neural processing unit (NPU), and/or a data processing unit (DPU), or may be implemented as an independent chip physically isolated from the other components of the main processor 2100.

The memories 2200a and 2200b may be used as a main memory device of the system 2000 and may include a volatile memory such as an SRAM and/or DRAM, or alternatively, the memories 2200a and 2200b may include a non-volatile memory such as a flash memory, a PRAM and/or RRAM. The memories 2200a and 2200b may be implemented in the same package with the main processor 2100.

The storage devices 2300a and 2300b may function as a non-volatile storage device for storing data regardless of whether power is supplied and may have a relatively large storage capacity as compared to the memories 2200a and 2200b. The storage devices 2300a and 2300b may include storage controllers 2310a and 2310b and non-volatile memory NVM storages 2320a and 2320b for storing data under the control of the storage controllers 2310a and 2310b. The non-volatile memories 2320a and 2320b may include a 2-dimensional (2D) structure or 3-dimensional (3D) V-NAND flash memory, or may include other types of non-volatile memory such as a PRAM and/or RRAM.

The storage devices 2300a and 2300b may be included in the electronic device 2000 in a state of being physically isolated from the main processor 2100 or may be implemented in the same package with the main processor 2100. Also, the storage devices 2300a and 2300b may have a shape the same as that of a solid state device (SSD) or a memory card, such that the storage devices 2300a and 2300b may be coupled to be attached to and detached from the other components of the electronic device 2000 through an interface such as a connection interface 2480. The storage devices 2300a and 2300b may be configured as devices to which standard conventions such as universal flash storage (UFS), embedded multi-media card (eMMC), or non-volatile memory express (NVMe) are applied, but an example embodiment thereof is not limited thereto.

The image capturing device 2410 may obtain a still image or a video and may be implemented by a camera, a camcorder, and/or a webcam.

The user input device 2420 may receive various types of data input from a user of the electronic device 2000 and may include a touch pad, a keypad, a keyboard, and a mouse and/or a microphone.

The sensor 2430 may detect various types of physical quantities obtained from an external entity of the electronic device 2000 and may convert the detected physical quantities into an electric signal. The sensor 2430 may be implemented by a temperature sensor, a pressure sensor, a luminance sensor, a position sensor, an acceleration sensor, a biosensor, and/or a gyroscope.

The communication device 2440 may transmit signals to and receive signals from other devices present externally of the electronic device 2000 according to various communication protocols. The communication device 2440 may include an antenna, a transceiver, and/or a modem (MODEM).

The display 2450 and the speaker 2460 may function as output devices for outputting visual and auditory information to a user of the electronic device 2000.

The power supply device 2470 may appropriately convert power supplied from a battery built in the electronic device 2000 and/or an external power source and may supply the power to each component of the electronic device 2000.

The connection interface 2480 may provide a connection between the electronic device 2000 and an external device connected to the electronic device 2000 and able to exchange data with the electronic device 2000. The connection interface 2480 may be implemented by various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), compact flash (CF) card interface, and the like.

Generally, when the OVS operation is applied to the recovery code, since the optimal read level is different from that of the HRT (history read level table) storing only pre-defined table (PDT) information, a level may be distorted in a subsequent wordline. With advancement in technology, the number of PDTs has increased as deterioration of memory cells has intensified. When OVS tables are introduced to improve error correction, the number of tables to be uploaded to the firmware (F/W) may increase.

The OVS recovery code in the example embodiment may improve valley searching correction and may reduce the number of PDTs. Generally, a correction range (e.g., <200 mV) of the OVS operation may be smaller than a correction range (e.g., −400 mV) of the PDT. Therefore, the PDT and OVS operation may be used together to secure a wide correction range. In the example embodiment, by extending the number of times the OVS operation is performed, the correction range of the OVS operation may be widened, and a latency required for the correction using failure information may be reduced.

In the storage device in the example embodiment, to completely replace a pre-defined table (PDT) with an on-chip valley search (OVS) operation, the history read level table (HRT) may be updated with the OVS table at every read retry. Generally, even when a UECC occurs in OVS operation, simply the cover range of the OVS may be insufficient, and the process of searching for the correct valley may still be performed. Therefore, when the offset corresponding to the HRT is updated even for the failure case, the search latency may be reduced because the OVS operation is performed from the changed read level when the reading is performed again.

In the reading method of the storage device in the example embodiment, upon entering the OVS recovery code after the UECC occurs, when the default read level is 4V and the optimal valley is 3.82V, an edge case may be detected as a first OVS operation, the read level offset may be confirmed as a first offset (−100 mV) referring to the OVS table, the first offset (−100 mV) may be stored in the history read level table (HRT) although a failure is obtained, and the number of OVS operations may be increased by 1. Since the read operation fails, the OVS operation may be re-executed. A central case may be detected as a second OVS operation, a second offset (−80 mV) may be configured referring to the OVS table, and the read level may be updated to the HRT regardless of a pass/failure. In this case, by accumulating the second offset (−80 mV) to the existing first offset (−100 mV) in the HRT, the accumulated offset (−180 mV) may be stored. The current HRT offset may be updated to −180 mV, and the number of OVS operations may be increased to 2.

In the example embodiment, the time point at which the accumulated offset is reset may be a time point at which the device enters a completely different type of recovery code, not the OVS recovery code.

The reading method of the storage device in the example embodiment may increase the correction range of the OVS recovery code, may improve the error correction capability and latency, and may reduce the rate of entering a read retry.

The OVS recovery code in the example embodiment may, after creating an OVS table based on OVS detection information, add an existing PDT thereto and may store the table in the HRT. The OVS recovery code in the example embodiment may search for an optimal valley using a predetermined OVS table without deteriorating normal RD performance.

As for a general OVS recovery code, the OVS and the second PDT may be performed when a failure occurs in the OVS and the first PDT, the OVS and the third PDT may be performed when a failure occurs in the OVS and the second PDT, and when the read operation has passed finally, the updating may be performed only on the history read level table (HRT). The OVS recovery code in the example embodiment may, by updating the HRT with the failure case, proceed from the updated voltage when the OVS operation is performed again. Accordingly, the search latency for searching for the distribution valley may be significantly reduced as compared to that of the general latency.

The OVS recovery code in the example embodiment may perform the OVS operation several times without proceeding to the life recovery code after a next OVS operation in order to increase the correction range of the OVS operation. Generally, when the life recovery codes are used, the execution time may increase exponentially, such that performance of the system (SET) may degrade rapidly. Therefore, to improve system performance, the correction may be performed in the OVS recovery code of which performance has been dropped insignificantly.

As for the storage device in the example embodiment, a correction range of the OVS table (OVST) may be 200 mV, which may be less than the correction range of the PDT, such that to increase the correction range of OVST, the number of corrections of OVST may be increased to N, and to accumulate an output value obtained using the OVST, an algorithm for accumulating the value in the HRT may be applied. The correction range of the OVST may increase by 200 mV at each time when the OVST is performed. For example, when the default read level is 4V, the read level (3.9V) of −100 mV may be moved when the OVST is performed once, and the OVST may be performed once again, such that movement to the read level (3.8V) of −100 mV may be available. When the OVST is performed ten times, the read level may decrease to 2V. However, turning too many loops may simply use the correction time and may deteriorate the correction capability, and thus, the limitation on the number of times for N may be necessary.

The reading method of the storage device in the example embodiment may include performing an on-chip valley search operation in at least one non-volatile memory device according to a first table (OVST) and a first read command, receiving detection information of the on-chip valley search operation according to a specific command, generating the first offset information corresponding to the detection information, storing the first offset information for each state and each detection operation of the non-volatile memory device in the first table, performing a first read command, obtaining first offset information, and performing again a first read command by moving the read level based on the first offset information when correction of read data by the first read command is failed.

The reading method of the storage device in the example embodiment may include performing an on-chip valley search operation in a buffer memory for storing a first table (OVST) and a second table (history RD Table); and at least one non-volatile memory device according to a first read command, receiving detection information of the on-chip valley search operation according to a specific command, generating the first offset information corresponding to the detection information, storing the first offset information for each state and each detection operation of the non-volatile memory device in the first table, storing second offset information corresponding to a history read level for each state and determined by the first offset information in a second table, performing a first read command, obtaining the first offset information, storing the second offset information in the second table regardless of whether correction of the read data is successful, and performing the first read command again referring to the second table.

The reading method of the storage device in the example embodiment may include performing an on-chip valley search operation in a buffer memory for storing a first table (OVST) and a second table (history RD Table); and at least one non-volatile memory device according to a first read command, receiving detection information of the on-chip valley search operation according to a specific command, generating the first offset information corresponding to the detection information, storing the first offset information for each state and each detection operation of the non-volatile memory device in the first table, performing an on-chip valley search when the first read command is performed, and performing the on-chip valley search again by changing the read level in a specific case.

According to the non-volatile memory device, the controller for controlling the same, the storage device including the same, and the reading method thereof described in the aforementioned example embodiment, by accumulating the offset corresponding to the detection case in the history read level table regardless of a failure of the OVS operation upon entering the OVS recovery code, the distribution valley of the next OVS operation may be swiftly searched for. Also, according to the non-volatile memory device, the controller for controlling the same, the storage device including the same, and the reading method thereof, by accumulating the history read level table regardless of failure of the OVS operation, the error correction range of the OVS operation may be extended.

Further, according to the non-volatile memory device, the controller for controlling the same, the storage device including the same, and the reading method thereof, since the existing PDT table is not used or reduced, performance may improve accordingly.

Also, according to the non-volatile memory device, the controller for controlling the same, the storage device including the same, and the reading method thereof, by reducing the possibility of entering the lifespan protection code, reliability of data may improve and performance may improve.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the example embodiments have been illustrated and described above, it will be apparent to those skilled in the art that modifications and variations could be made without departing from the scope of the present disclosure as defined by the appended claims.

What is claimed is:

1. A reading method of a storage device including at least one non-volatile memory device and a controller configured to control the at least one non-volatile memory device, the method comprising:
performing, by the at least one non-volatile memory device, a first on-chip valley search (OVS) operation in response to a read command from the controller;
receiving, by the controller, first detection information of the first OVS operation in response to a specific command from the controller;
updating, by the controller, a second table with a first offset corresponding to the first detection information using a first table; and
performing, by the at least one non-volatile memory device, a second OVS operation using the second table in response to a reissued read command from the controller, wherein:
the first table includes the first offset according to a detection case for each state, and
the second table includes a second offset of a read level for each state.

2. The method of claim 1, wherein the performing of the first OVS operation includes:
entering an OVS recovery code when read data is uncorrectable;
determining whether to perform a history read operation; and
performing an OVS sensing operation and a normal read operation when the history read operation is not performed.

3. The method of claim 2, wherein the performing of the first OVS operation further includes performing the OVS sensing operation and the history read operation.

4. The method of claim 1, further comprising:
receiving, by the controller, data read in the first OVS operation; and
determining, by the controller, whether the read data is error-correctable, wherein
the second OVS operation is performed when the read data is uncorrectable.

5. The method of claim 1, further including determining, by the controller, whether the first OVS operation is passed after the updating the second table with the first offset.

6. The method of claim 5, further comprising determining whether to allow the second OVS operation when the first OVS operation is not passed.

7. The method of claim 6, wherein the determining whether to allow the second OVS operation includes determining whether the number of times the OVS operation is performed exceeds a reference value.

8. The method of claim 6, further comprising performing, by the at least one non-volatile memory device, an off-chip valley search operation when the second OVS operation is not allowed.

9. The method of claim 1, wherein each of the performing of the first OVS operation and the performing of the second OVS operation includes:
determining whether the detection case according to the OVS sensing operation is an edge case;
changing a read level to a changed read level when the detection case is the edge case; and
performing a next OVS sensing operation using the changed read level.

10. The method of claim 1, further comprising:
receiving, by the controller, second detection information of the second OVS operation in response to the specific command; and
updating, by the controller, the second table with a second offset corresponding to the second detection information using the first table.

11. A reading method of a storage device including at least one non-volatile memory device and a controller configured to control the at least one non-volatile memory device, the method comprising:
determining whether to perform a history read operation or a normal read operation according to a read request;
performing the history read operation or the normal read operation;
determining whether data read in the history read operation or the normal read operation is uncorrectable;
entering an on-chip valley search (OVS) recovery code when the read data is uncorrectable;
performing a first OVS operation with reference to a read level in the OVS recovery code;
determining a first detection case according to the first OVS operation;
determining whether the first OVS operation is passed;
determining whether to allow a second OVS operation when the first OVS operation is not passed;
changing the read level to a changed read level when the second OVS operation is allowed;
performing the second OVS operation with reference to the changed read level; and
updating a history read table with an offset corresponding to the first detection case when the OVS recovery code is passed.

12. The method of claim 11, wherein the changing of the read level includes changing, by the at least one non-volatile memory device, the read level by an offset corresponding to the first detection case.

13. The method of claim 11, wherein the changing the read level includes changing, by the controller, the read level by an offset corresponding to the first detection case.

14. The method of claim 11, further comprising:
determining a second detection case according to the second OVS operation; and
determining whether the second OVS operation is passed.

15. The method of claim 14, further comprising:
receiving, from the at least one non-volatile memory device, detection information corresponding to a corresponding detection case in response to a specific command from the controller when the first OVS operation is passed or the second OVS operation is passed; and
determining an offset corresponding to the detection information using an OVS table, wherein
the OVS table includes an offset according to a detection case for each state.

16. A non-volatile memory device comprising:
a memory cell array including a plurality of memory blocks having a plurality of memory cells connected to a plurality of wordlines and a plurality of bitlines;
a row decoder configured to select one of the plurality of memory blocks in response to an address;
a voltage generator configured to provide wordline voltages corresponding to a selected wordline and unselected wordlines from among the plurality of wordlines;
page buffers connected to the plurality of bitlines and configured to read data from memory cells connected to the selected wordline of a selected memory block among the plurality of memory blocks; and
a control logic configured to control the row decoder, the voltage generator, and the page buffers, wherein:
the control logic includes an OVS circuit configured to receive a command latch enable (CLE) signal, an address latch enable (ALE) signal, a chip enable (CE) signal, a write enable (WE) signal, a read enable (RE) signal, and a DQS signal through control pins and to perform an on-chip valley search (OVS) by latching a command or an address at an edge of the WE signal according to the CLE signal and the ALE signal,
the control logic:
performs a first OVS operation in response with reference to a read level;
receives first detection information of the first OVS operation;
updates a second table with a first offset corresponding to the first detection information using a first table; and
performs a second OVS operation with reference to a changed read level using the second table,
the first table includes the first offset according to a detection case for each state, and
the second table includes a second offset of a read level for each state.

17. The non-volatile memory device of claim 16, wherein the OVS circuit determines whether a detection case according to the first OVS operation is an edge case.

18. The non-volatile memory device of claim 17, wherein when the detection case is not the edge case, the OVS circuit outputs data according to the first OVS operation and outputs detection information corresponding to the detection case in response to a specific command.

19. The non-volatile memory device of claim 17, wherein when the detection case is the edge case, the OVS circuit changes the read level and performs the second OVS operation with reference to the changed read level.

20. The non-volatile memory device of claim 16, wherein the number of times the first OVS operation is performed in response to one read command does not exceed a reference value.

* * * * *